United States Patent
Deutsch et al.

(10) Patent No.: US 12,254,203 B2
(45) Date of Patent: Mar. 18, 2025

(54) MESSAGE AUTHENTICATION GALOIS INTEGRITY AND CORRECTION (MAGIC) FOR LIGHTWEIGHT ROW HAMMER MITIGATION

(71) Applicant: Intel Corporation, Santa Clara, CA (US)

(72) Inventors: Sergej Deutsch, Hillsboro, OR (US); Christoph Dobraunig, St. Veit an der Glan (AT); Rajat Agarwal, Portland, OR (US); David M. Durham, Beaverton, OR (US); Santosh Ghosh, Hillsboro, OR (US); Karanvir Grewal, Hillsboro, OR (US); Krystian Matusiewicz, Gdansk (PL)

(73) Assignee: Intel Corporation, Santa Clara, CA (US)

( * ) Notice: Subject to any disclaimer, the term of this patent is extended or adjusted under 35 U.S.C. 154(b) by 5 days.

(21) Appl. No.: 18/145,095

(22) Filed: Dec. 22, 2022

(65) Prior Publication Data
US 2023/0402077 A1    Dec. 14, 2023

Related U.S. Application Data

(60) Provisional application No. 63/351,613, filed on Jun. 13, 2022.

(51) Int. Cl.
*G06F 3/06* (2006.01)
*G11C 7/24* (2006.01)

(52) U.S. Cl.
CPC .......... *G06F 3/064* (2013.01); *G06F 3/0619* (2013.01); *G11C 7/24* (2013.01); *G06F 3/0679* (2013.01)

(58) Field of Classification Search
CPC ....... G11C 7/24; G06F 3/0679; G06F 3/0619; G06F 3/064
USPC .......................................................... 714/764
See application file for complete search history.

(56) References Cited

U.S. PATENT DOCUMENTS

| | | | |
|---|---|---|---|
| 7,099,190 B2 * | 8/2006 | Noguchi | G11C 16/0483 365/185.11 |
| 9,411,818 B2 * | 8/2016 | Motwani | H04L 67/1097 |
| 9,686,440 B2 * | 6/2017 | Metcalfe | H04N 1/6072 |
| 10,678,636 B2 | 6/2020 | Durham | |
| 11,301,344 B2 | 4/2022 | Durham et al. | |
| 11,469,902 B2 | 10/2022 | Kounavis et al. | |
| 11,675,502 B1 * | 6/2023 | Resch | G06F 3/064 714/763 |

(Continued)

OTHER PUBLICATIONS

L. Cojocar, K. Razavi, C. Giuffrida and H. Bos, "Exploiting Correcting Codes: On the Effectiveness of ECC Memory Against Rowhammer Attacks," 2019 IEEE Symposium on Security and Privacy (SP), San Francisco, CA, USA, 2019, pp. 55-71, doi: 10.1109/SP.2019.00089.

*Primary Examiner* — Guy J Lamarre
(74) *Attorney, Agent, or Firm* — Nicholson De Vos Webster & Elliott LLP

(57) ABSTRACT

The technology described herein includes a first plurality of bijection diffusion function circuits to diffuse data bits into diffused data bits and store the diffused data bits into a memory; an error correcting code (ECC) generation circuit to generate ECC bits for the data bits; and a second plurality of bijection diffusion function circuits to diffuse the ECC bits into diffused ECC bits and store the diffused ECC bits into the memory.

20 Claims, 13 Drawing Sheets

(56) References Cited

U.S. PATENT DOCUMENTS

| | | | |
|---|---|---|---|
| 2002/0083390 A1* | 6/2002 | Lee | G06F 11/1072 |
| | | | 714/766 |
| 2004/0139340 A1* | 7/2004 | Johnson | H04L 9/0625 |
| | | | 380/1 |
| 2009/0102850 A1* | 4/2009 | Liang | G09G 3/2059 |
| | | | 345/545 |
| 2013/0166990 A1* | 6/2013 | Morris | G06F 11/1008 |
| | | | 714/764 |
| 2014/0068320 A1* | 3/2014 | Vedpathak | G06F 11/1076 |
| | | | 714/6.2 |
| 2016/0328540 A1* | 11/2016 | Hoogerbrugge | G06F 21/602 |
| 2017/0185532 A1* | 6/2017 | Durham | G06F 11/1004 |
| 2019/0042369 A1* | 2/2019 | Deutsch | G06F 3/0673 |
| 2019/0220349 A1* | 7/2019 | Deutsch | G06F 11/1048 |
| 2021/0390024 A1* | 12/2021 | Durham | G06F 21/79 |
| 2024/0220357 A1* | 7/2024 | Durham | H04L 9/0816 |

* cited by examiner

MESSAGE AUTHENTICATION GALOIS INTEGRITY AND CORRECTION (MAGIC) FOR LIGHTWEIGHT ROW HAMMER MITIGATION

CROSS-REFERENCE TO RELATED APPLICATION

This application claims the benefit of US Provisional Patent Application No. 63/351,613, filed Jun. 13, 2022, which is incorporated by reference herein in its entirety.

FIELD OF THE DISCLOSURE

This disclosure relates generally to security in computing systems, and more particularly, to deterring row hammer attacks against computing systems.

BACKGROUND

Row hammer (RH) attacks on memory, such as dynamic random-access memory (DRAM), are a threat for cloud service providers (CSPs), despite numerous mitigation techniques proposed in the recent past. A RH attack exploits an undesirable effect of cross talk between adjacent memory cells in the memory, allowing an adversary to change a victim's memory content in a particular row by repeatedly accessing ("hammering") data at a different row which is physically adjacent to the victim's memory content. A RH exploit can be used for privilege escalation by malicious actors. Current RH mitigation techniques are ineffective or are impractical due to significant negative performance impact and/or storage overhead costs.

A row hammer adversary is often a software only adversary that can change the data stored in adjacent memory cells, which may be used by other unprivileged or privileged processes such as the operating system (OS). Physical RH attacks are also possible. Due to the deterministic nature of error correction codes (ECC), ECC-DRAM is also affected.

BRIEF DESCRIPTION OF THE DRAWINGS

The figures are not to scale. In general, the same reference numbers will be used throughout the drawing(s) and accompanying written description to refer to the same or like parts.

DETAILED DESCRIPTION

Figure 1:
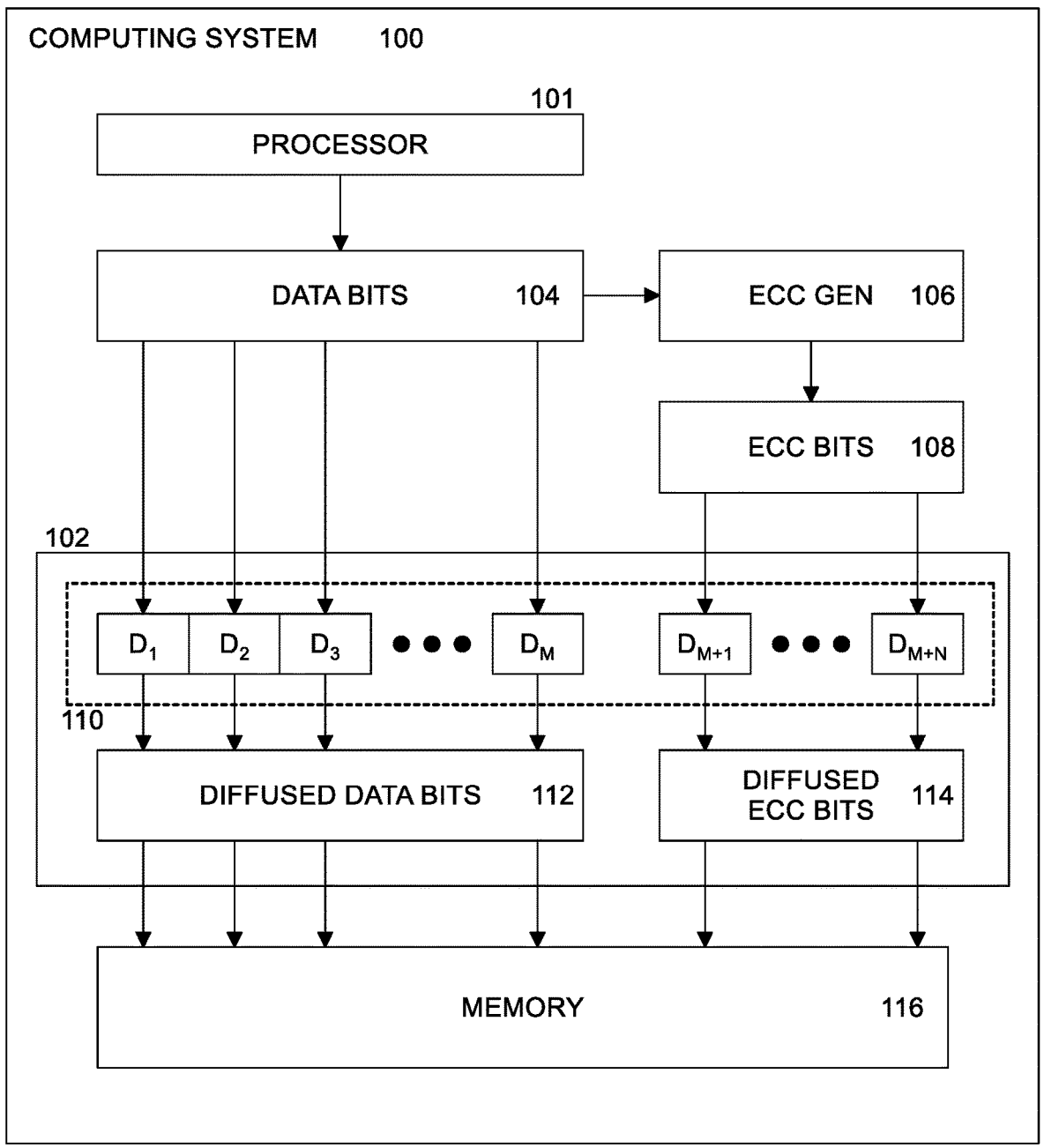
FIG. 1 illustrates diffusion layer circuitry in a portion of a computing system wherein data bits and ECC bits are divided into s-bit blocks and bijective diffusion function D circuitry is applied to each block according to an implementation.

The technology described herein provides for a low-cost and lightweight (e.g., little or no performance impact) RH exploit detection and mitigation method that builds on top of existing ECCs and does not require additional storage in ECC memory. The technology provides a method and system that increases computer security by adding cryptographic s-bit diffusion on top of existing ECC processing (e.g., Reed-Solomon (RS) code processing), leaving the error-correction capabilities of the RS code unchanged. As long as an attacker cannot read the stored redundant information, authenticity is added, thereby precluding RH attacks. Assuming that memory encryption (such as that provided by multi-key total memory encryption (MKTME) or other suitable encryption method) is being used in the computing system, the technology described herein can be applied without a latency penalty on memory reads. Due to progressive minimization of process technologies for memory, the abilities of attackers to mount RH attacks are likely to get worse. The technology described herein provides protection against this attack vector with only a small impact on performance.

In the following detailed description, reference is made to the accompanying drawings that form a part hereof, and in which is shown by way of illustration specific examples that may be practiced. These examples are described in sufficient detail to enable one skilled in the art to practice the subject matter, and it is to be understood that other examples may be utilized and that logical, mechanical, electrical and/or other changes may be made without departing from the scope of the subject matter of this disclosure. The following detailed description is, therefore, provided to describe example implementations and not to be taken as limiting on the scope of the subject matter described in this disclosure. Certain features from different aspects of the following description may be combined to form yet new aspects of the subject matter discussed below.

As used herein, connection references (e.g., attached, coupled, connected, and joined) may include intermediate members between the elements referenced by the connection reference and/or relative movement between those elements unless otherwise indicated. As such, connection references do not necessarily infer that two elements are directly connected and/or in fixed relation to each other. As used herein, stating that any part is in "contact" with another part is defined to mean that there is no intermediate part between the two parts.

Unless specifically stated otherwise, descriptors such as "first," "second," "third," etc., are used herein without imputing or otherwise indicating any meaning of priority, physical order, arrangement in a list, and/or ordering in any way, but are merely used as labels and/or arbitrary names to distinguish elements for ease of understanding the disclosed examples. In some examples, the descriptor "first" may be used to refer to an element in the detailed description, while the same element may be referred to in a claim with a different descriptor such as "second" or "third." In such instances, it should be understood that such descriptors are used merely for identifying those elements distinctly that might, for example, otherwise share a same name. As used herein, "approximately" and "about" refer to dimensions that may not be exact due to manufacturing tolerances and/or other real-world imperfections.

As used herein, "processor circuitry" or "hardware resources" is defined to include (i) one or more special purpose electrical circuits structured to perform specific operation(s) and including one or more semiconductor-based logic devices (e.g., electrical hardware implemented by one or more transistors), and/or (ii) one or more general purpose semiconductor-based electrical circuits programmed with instructions to perform specific operations and including one or more semiconductor-based logic devices (e.g., electrical hardware implemented by one or more transistors). Examples of processor circuitry include programmed microprocessors, Field Programmable Gate Arrays (FPGAs) that may instantiate instructions, Central Processor Units (CPUs), Graphics Processor Units (GPUs), Digital Signal Processors (DSPs), XPUs, or microcontrollers and integrated circuits such as Application Specific Integrated Circuits (ASICs). For example, an XPU may be implemented by a heterogeneous computing system including multiple types of processor circuitry (e.g., one or more FPGAs, one or more CPUs, one or more GPUs, one or more DSPs, etc., and/or a combination thereof) and application programming interface(s) (API(s)) that may assign computing task(s) to whichever one(s) of the multiple types of the processing circuitry is/are best suited to execute the computing task(s).

As used herein, a computing system can be, for example, a server, a personal computer, a workstation, a self-learning machine (e.g., a neural network), a mobile device (e.g., a cell phone, a smart phone, a tablet (such as an iPad™)), a personal digital assistant (PDA), an Internet appliance, a DVD player, a CD player, a digital video recorder, a Blu-ray player, a gaming console, a personal video recorder, a set top box, a headset (e.g., an augmented reality (AR) headset, a virtual reality (VR) headset, etc.) or other wearable device, or any other type of computing device. A computing system may include one or more memorys (e.g., DRAMs) to store data.

There have been several previous approaches to attempt to mitigate RH attacks in memories (e.g., DRAMs) in computing systems, including adding cryptographic authentication via a message authentication code (MAC), implementing Message Authentication Galois Integrity and Correction (MAGIC) with 64-bit/128-bit blocks providing simultaneous data authentication and error correction, implementing Target Row Refresh (TRR) in double data rate 4 synchronous DRAM (DDR4), and using Error Correction Codes (ECC).

MACs require the storage of additional information called tags to verify the authenticity of data. This additional tag information reduces the space available for the redundant information of ECC, thus negatively impacting error correction capabilities. The technology described herein does not require additional ECC bits or sequestered memory. MAGIC with 128-bit blocks provides error correction at the bit level with no storage overhead. However, MAGIC with 128-bit blocks lacks the capabilities of currently deployed ECC of handling full device or partial device failures. While some MAGIC implementations provide error correction and message authentication, existing MAGIC implementations require major changes in the ECC circuitry due to the use of a different ECC algorithm, which requires additional design and validation effort to implement with existing ECC circuit designs. The RH mitigation technique described herein builds upon existing ECC circuitry, and hence is much easier to implement and validate. TRR does not protect against TRR-aware variants of RH attacks. While ECC is effective in detecting (and possibly correcting) random corruptions, ECC can be bypassed by inducing targeted errors that are undetected or mis-corrected by the ECC algorithm.

A memory, such as DRAM, is made up of capacitors for each bit that store charges symbolling a stored 0 or 1. Parasitic effects lead to a discharge of the capacitors over time, so that the information must be periodically read and refreshed. Those parasitic effects can be influenced by manipulating capacitors in close physical proximity that are under adversarial control. This can lead to a change in the charge of a victim capacitor before the information is refreshed and hence to a change in the victim's stored data. Many exploits can make use of this effect ranging from privilege escalation to the manipulation of cryptographic keys, potentially invalidating the confidentiality of all future communications.

One cause of the problem is the shrinking in semiconductor process technology, leading to declining capacities, closer physical proximities, and worse parasitic effects, together with the interval for refreshing. It is unlikely that there will be a reversal (e.g., physical enlargement) in process technologies. In addition, an increase in the refresh interval is unlikely to happen due to severe performance impacts. Thus, RH attacks may get more prevalent.

The technology described herein applies a block-wise diffusion on top of data and ECC bits, which makes it difficult for a RH adversary to bypass ECC by inducing errors that are undetected or mis-corrected.

FIG. 1 illustrates diffusion layer circuitry 102 in a portion of a computing system 100 wherein data bits 104 and ECC bits 108 are divided into s-bit blocks (e.g., 8-bit or 16-bit blocks) and bijective diffusion function circuitry 110 is applied to each block according to an example. In an implementation, diffusion layer circuitry 102 may be included in a processor 101 of computing system 100. In other implementations, diffusion layer circuitry 102 and/or diffusion layer processing may be included in other hardware, firmware, or software components of the computing system. In an implementation, processor 101 may generate data bits 104. Other components in computing system 100 are omitted from FIG. 1 for clarity. Data bits 104 from a processor 101 of computing system 100 are sent to ECC generator (GEN) circuitry 106 to generate ECC bits 108. Data bits 104 and the ECC bits 108, as divided into s-bit blocks, are input to a plurality of bijection diffusion function circuits 110. In various implementations, for example, the value of s may be 2, 4, 8, 16, or 32, etc., and the number of data bits may be 64, 128, 256, 512, or 1024, etc., and the number of ECC bits may be 2, 4, 8, or 16, etc., in any combination. The bijection diffusion function D circuits comprise a plurality of individual circuits $D_1, D_2, D_3, \ldots D_M$ for data bits 104 and $D_M+1, D_{M+N}$ for ECC bits 108, where M and N are natural numbers and the values of M and N are dependent on the implementation. Thus, M is the number of blocks of data and N is the number of ECC blocks processed at a time. In an implementation, the D circuits are instances of the same circuit. In another implementation, at least one of the D circuits is different than other D circuits. In another implementation, a bijection diffuser function D may use an index into the set of D circuits as an input tweak to ensure that the output data of the D circuits are not correlated even if the input data are the same.

The output of the plurality of bijection diffusion function circuits 110 operating on data bits 104 is diffused data bits 112 and the output of the plurality of bijection diffusion function circuits 110 operating on ECC bits 108 is diffused ECC bits 114. The diffused data bits 112 and the diffused ECC bits 114 are written to memory (e.g., a DRAM) 116.

There are many possible ways to instantiate the bijective diffusion function circuits 110, depending on the implementation. In an implementation, such bijective diffusion functions may comprise s-bit (e.g., tweakable) block ciphers. For example, an 8-bit tweakable block cipher may be implemented as a series of look-up tables containing random permutations of values 0 to 255, where each tweak addresses a different look-up table. However, due to the limited capabilities of a RH attacker, cryptographically weaker constructions may be used. Other possible implementations of bijective s-bit diffusion functions for various s values include format-preserving encryption schemes such as is defined in "Block Cipher Modes of Operation", draft 1, February 2019, National Institute of Standards and Technology (NIST) SP 800-38G, or dedicated IC designs for a specific s value.

The diffusion layer circuitry 102 does not affect error correction in a normal case, as long as any errors are within correctable boundaries of the ECC processing. For instance, a 16-bit RS code corrects entire 16-bit symbols, regardless of what bits are corrupted within a symbol, so a 16-bit diffusion will have no impact in this case.

The present system works with any diffusion scheme. The present system does not change the characteristics of symbol-based error correction codes such as RS codes as long as the symbol size matches the block size of the diffusion layer. However, non-matching combinations are also possible. The resulting security levels depend on the code and should be checked. The diffusion layer circuitry 102 consists of the parallel application of the bijective diffusion function circuits 110 on s-bit blocks.

Figure 2:
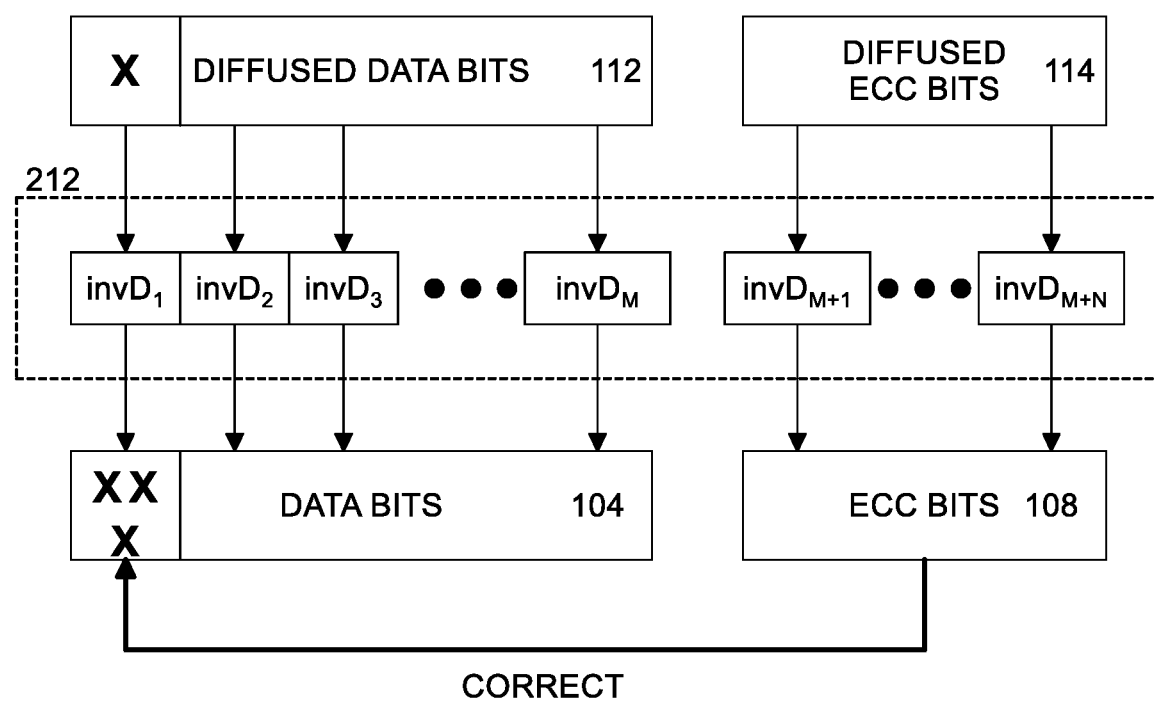
FIG. 2 shows how a single-bit error in memory is translated to multiple-bit errors within the same symbol or block in one example.
Figure 3:
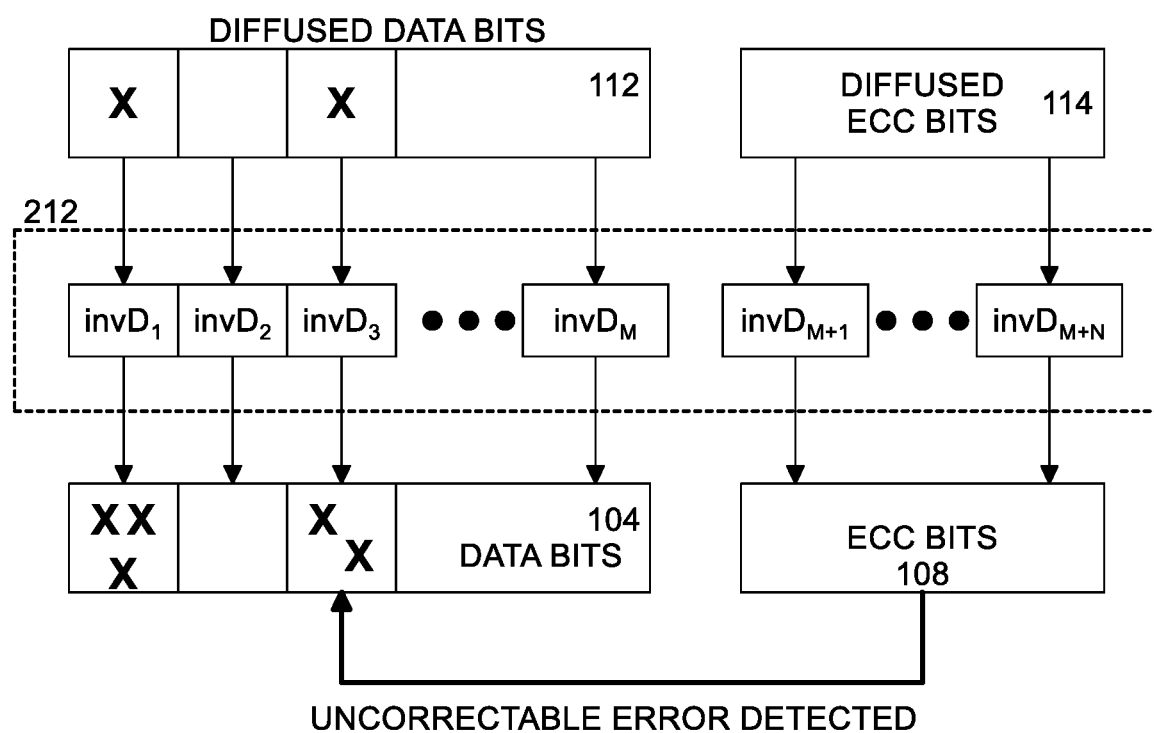
FIG. 3 illustrates an uncorrectable error being detected according to one example.

FIG. 2 shows how a single-bit error in memory 116 is translated due to inverse-blinding to multiple-bit errors within the same symbol or block, but ECC processing can still correct the error, in one example. A RH adversary needs to corrupt a specific combination of bits spread across multiple blocks to achieve an undetected/mis-corrected error. However, as shown in the example of FIG. 3, application of a plurality of inverse diffusion functions 212 effectively "randomizes" errors before error correction, so a RH adversary has no deterministic way of causing such an error, since diffusion operations are data dependent and secret dependent.

The application of the plurality of bijection diffusion functions may be done in two different approaches: 1) "inside-out" MAGIC; and 2) "outside-in" MAGIC.

Figure 4:
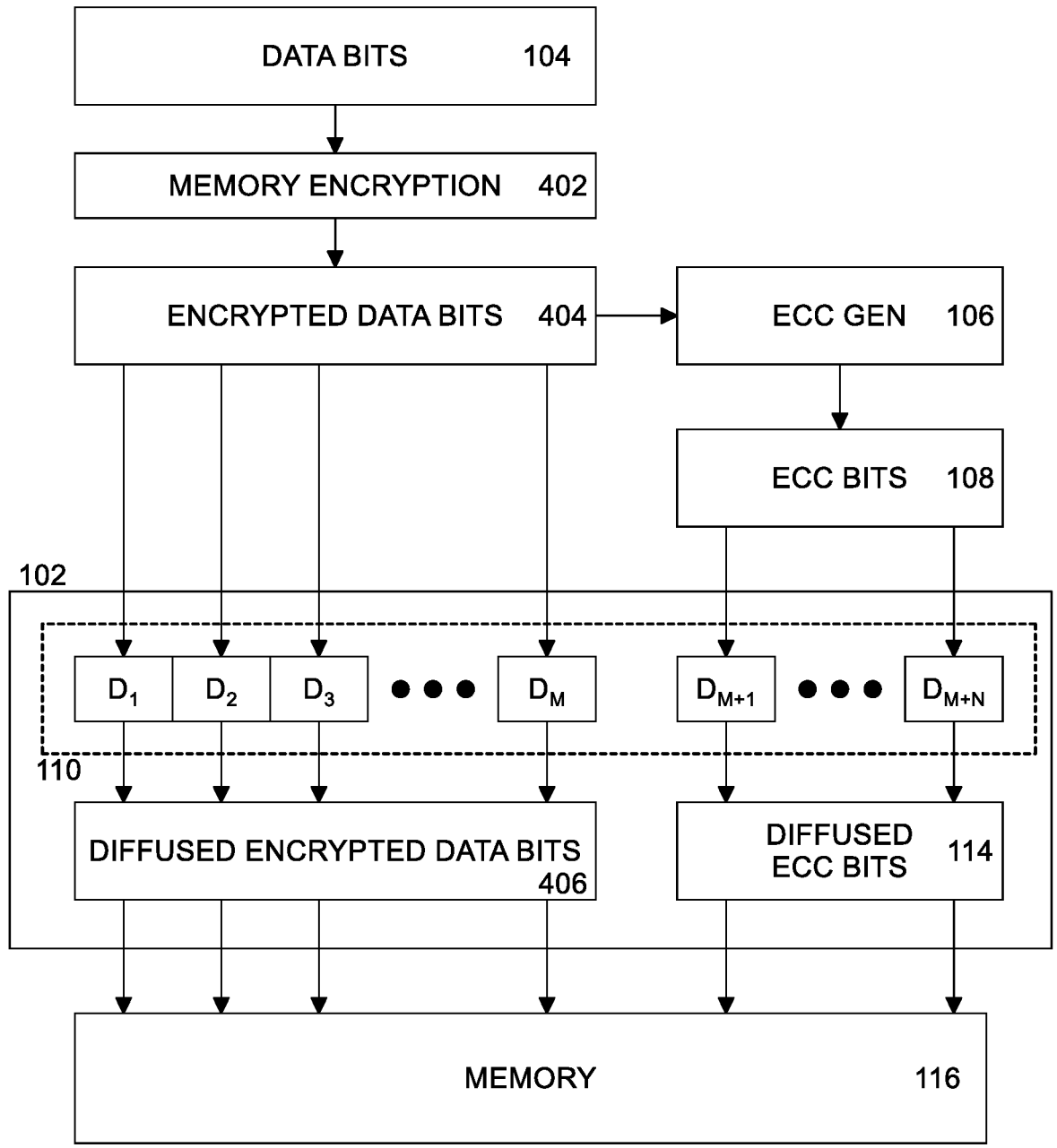
FIG. 4 illustrates an "inside-out" write operation in a first implementation.

As shown in FIG. 4, in a first approach, memory encryption circuitry 402 may be used in conjunction with an "inside-out" style s-bit MAGIC. This means when writing data to memory, memory encryption of the data bits 104 is performed first by memory encryption circuitry 402 to generate encrypted data bits 404, then the ECC is computed using ECC GEN circuitry 106 on the encrypted data bits 404 to generate ECC bits 108, followed by the write diffusion layer circuitry 102 comprising diffusion function circuits 110 to produce diffused encrypted data bits 406 and diffused ECC bits 114 from encrypted data bits 404 and ECC bits 108, respectively. The diffused encrypted data bits 406 and diffused ECC bits 114 are then stored in a memory 116 (e.g., a DRAM). The total latency overhead versus a plain write to memory is the sum of the latencies of memory encryption circuitry 402, ECC GEN circuitry 106, and write diffusion layer circuitry 103 processing.

Thus, a write operation for the "inside-out" approach includes receiving data (which may be encrypted) from a processor, generating ECC bits from the data bits, diffusing the data bits and the ECC bits resulting in diffused data bits and diffused ECC bits, and writing the diffused data bits and the diffused ECC bits to the memory. Diffusing of the data bits and the ECC bits may be done in parallel.

Figure 5:
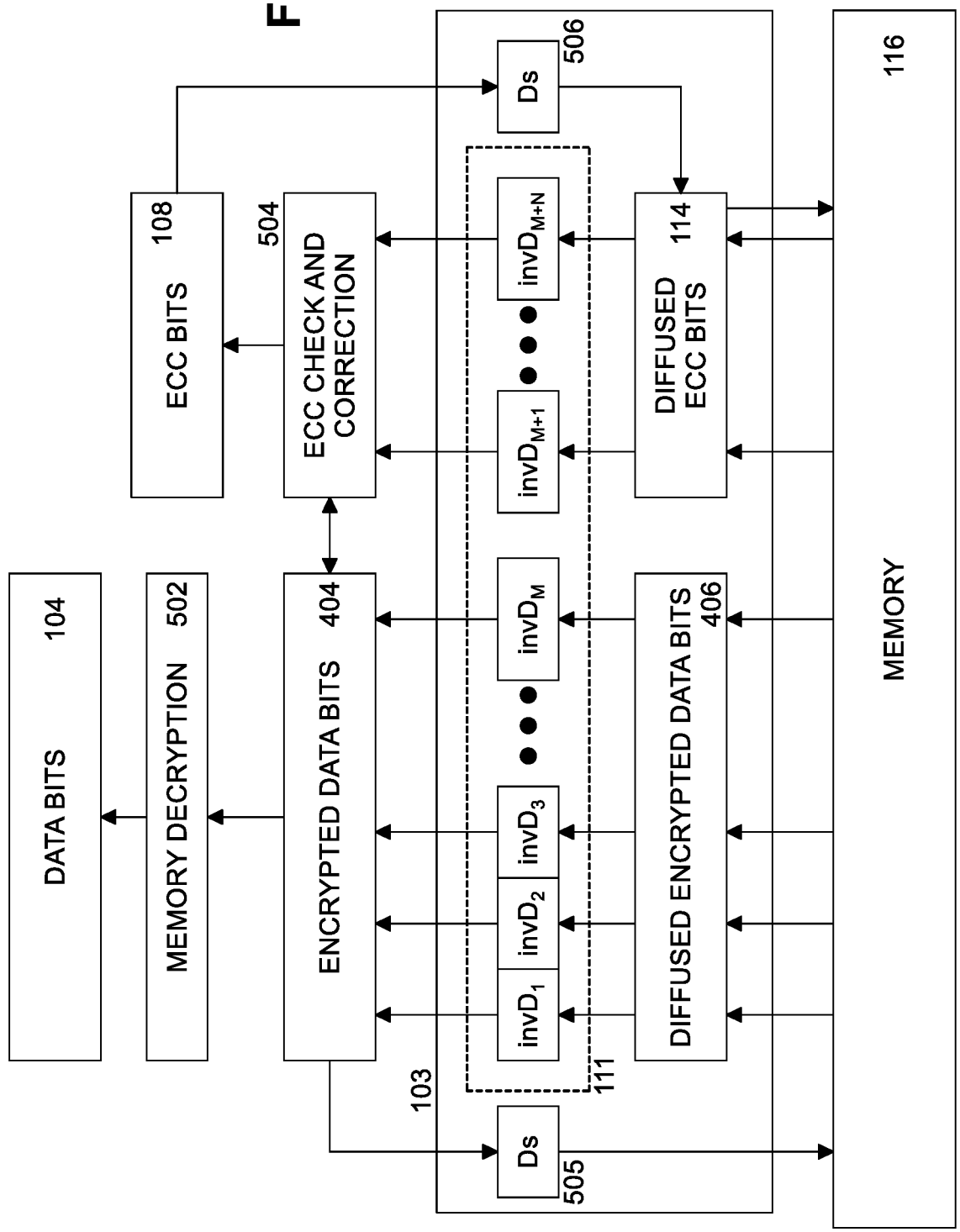
FIG. 5 illustrates an "inside-out" read operation in the first implementation.

As shown in FIG. 5, in the first approach (e.g., "inside-out" style s-bit MAGIC), to read data from memory, first the read diffusion layer circuitry 103 comprising inverse diffusion function circuitry 111 generates encrypted data bits 404 from diffused encrypted data bits 406 and inverse diffused ECC bits (e.g., ECC bits are now cleartext) from diffused ECC bits 114. Next, ECC error check and correction circuitry 504 generates ECC bits 108 from the inverse diffused ECC bits. ECC bits 108 are then diffused by diffusion function $D_s$ circuit 506 and stored as diffused ECC bits 114 back to Memory 116. Corrected encrypted data bits 404 are diffused by diffusion function circuit $D_s$ 505 and stored as diffused encrypted data bits 406 back to memory 116. Memory decryption circuitry 502 generates data bits 104 from encrypted data bits 404. The (decrypted) data bits 104 may then be used in a further processing in computing system 100. Memory decryption processing and ECC check and correction processing may be done in parallel.

Thus, a read operation for the "inside-out" approach includes receiving diffused data bits (which may be encrypted) and diffused ECC bits data from a memory, applying inverse diffusion on the diffused data bits and the diffused ECC bits, and performing an error check on the data bits and the ECC bits. If a correctable error is detected, the data bits are corrected and the ECC bits are re-generated, the corrected data bits and the new ECC bits are diffused, and the diffused data bits and diffused ECC bits are written back to the memory. The corrected data bits may be decrypted and returned to the processor. Inverse diffusing of the data bits and error checking the ECC bits may be done in parallel.

Figure 6:
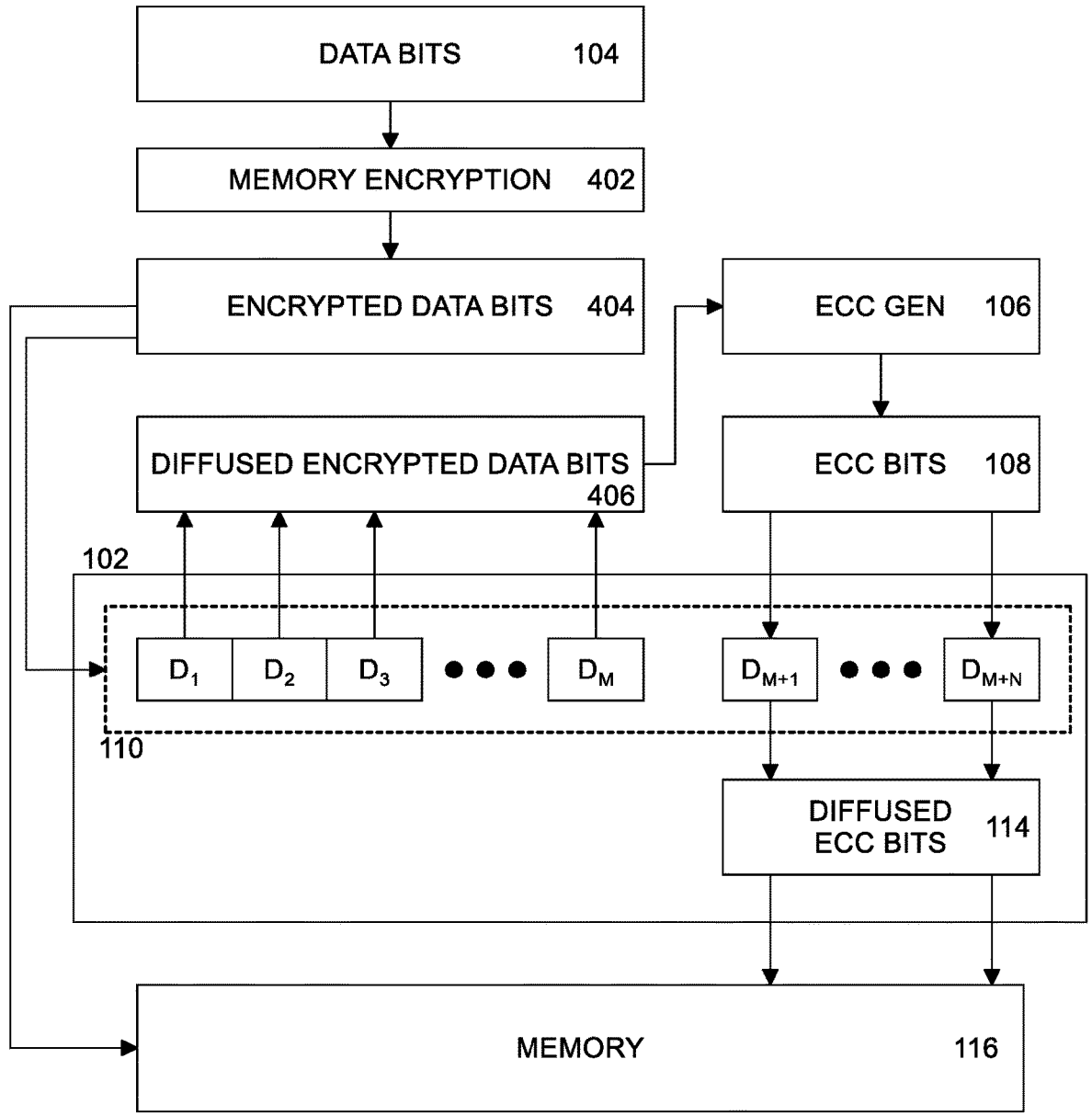
FIG. 6 illustrates an "outside-in" write operation in a second implementation.

In a second approach, memory encryption circuitry 402 may be used in conjunction with "outside-in" s-bit MAGIC. In this case, the order of operations for writing data to memory (e.g., memory) 116 is as shown in FIG. 6. First, the data bits 104 are encrypted by memory encryption circuitry 402 (e.g., MKTME circuitry). The resulting encrypted data bits 404 (e.g., ciphertext) is stored in memory 116 and also forms the input to simultaneous data authentication and error correction. The simultaneous data authentication and error correction feeds the encrypted data bits 404 through the parallel diffusion function circuits 110 of diffusion layer circuitry 102 to produce diffused encrypted data bits 406. The diffused encrypted data bits 406 now form the input to ECC GEN circuitry 106, which computes the redundant information (e.g., ECC bits 108) used for authentication and error correction. The redundant information (e.g., ECC bits 108) is diffused by diffusion function circuits 110 of diffusion layer circuitry 102 and stored in memory 116 as diffused ECC bits 114. The total latency overhead versus a plain write to memory is the sum of the latencies of memory encryption circuitry 402, ECC GEN circuitry 106, and two times the diffusion layer circuitry 102.

Thus, a write operation for the "outside-in" approach includes receiving data (which may be encrypted) from a processor, diffusing the data bits resulting in diffused data bits, generating ECC bits from the diffused data bits, diffusing the ECC bits resulting in diffused ECC bits, and writing the data bits and the diffused ECC bits to the memory. Writing of the data bits and generating and writing the diffused ECC bits may be done in parallel.

Figure 7:
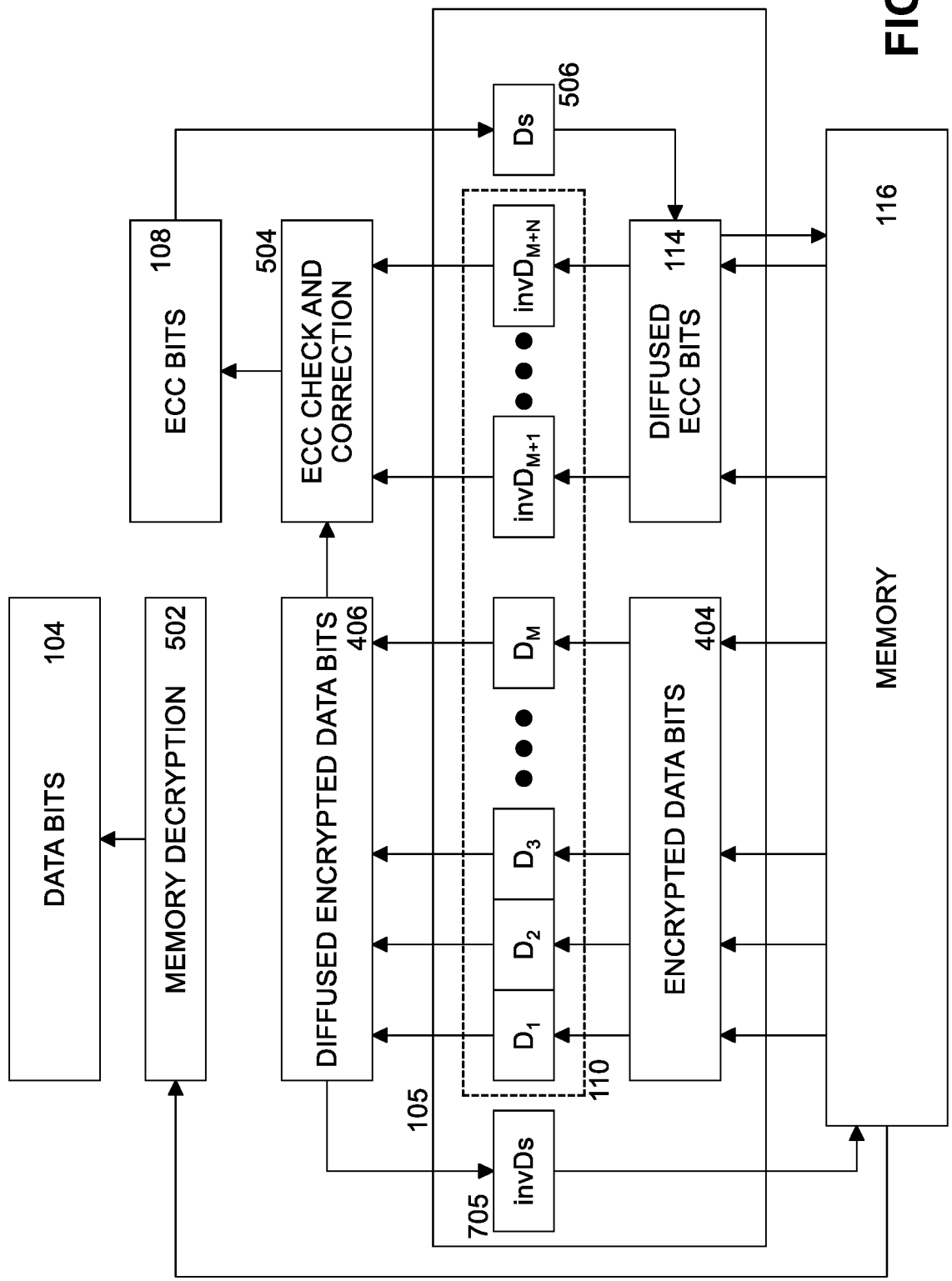
FIG. 7 illustrates an "outside-in" read operation in the second implementation.

However, when examining a read from memory for the "outside-in" case shown in FIG. 7, it can be observed that decryption by memory decryption circuitry 502 and simultaneous data authentication and error correction by diffusion layer circuitry 102 and ECC GEN circuitry 106 may be done in parallel. This means that the added latency over a plain read from memory may be the maximum of the latency of memory decryption circuitry 502 and the latency of diffusion layer circuitry 102 plus ECC GEN circuitry 106. If the latency of memory decryption circuitry 502 dominates, there is no additional latency penalty from adding simultaneous data authentication and error correction.

Thus, a read operation for the "outside-in" approach includes receiving data bits 404 (which may be encrypted) and diffused ECC bits 114 from a memory, applying diffusion on the data bits and inverse diffusion on the diffused ECC bits, and performing an error check on the data bits and the ECC bits. If a correctable error is detected, the diffused data bits are corrected and the ECC bits are re-generated and diffused by diffusion function circuitry 506, inverse diffusion (invD$_s$ 705) is applied to the corrected data bits, and the updated data bits and updated diffused ECC bits are written back to the memory. The corrected data bits may be decrypted by memory decryption circuitry 502 and data bits 104 may be returned to the processor.

If it can be assumed that errors in memory are rare, it can make sense from a performance perspective to not wait until the check for correctness of data by MAGIC is performed and only then start the decryption processing. Rather, it makes sense to start decryption processing as early as possible and then pull the decrypted data back in case an error is detected or corrected. Speculative decryption is possible for the first example of performing the memory encryption and then "inside-out" MAGIC as shown in FIG. 4 and for the second example of performing memory encryption and then "outside-in" MAGIC as shown in FIG. 6. One advantage of "outside-in" MAGIC is that memory decryption does not have to wait for the inverse diffusion processing (e.g., by inverse diffusion function circuitry 705) to complete before memory decryption processing can be start. In all cases, it is also possible to do the decryption in-order (performing the memory decryption can wait until MAGIC is completed).

Figure 8:
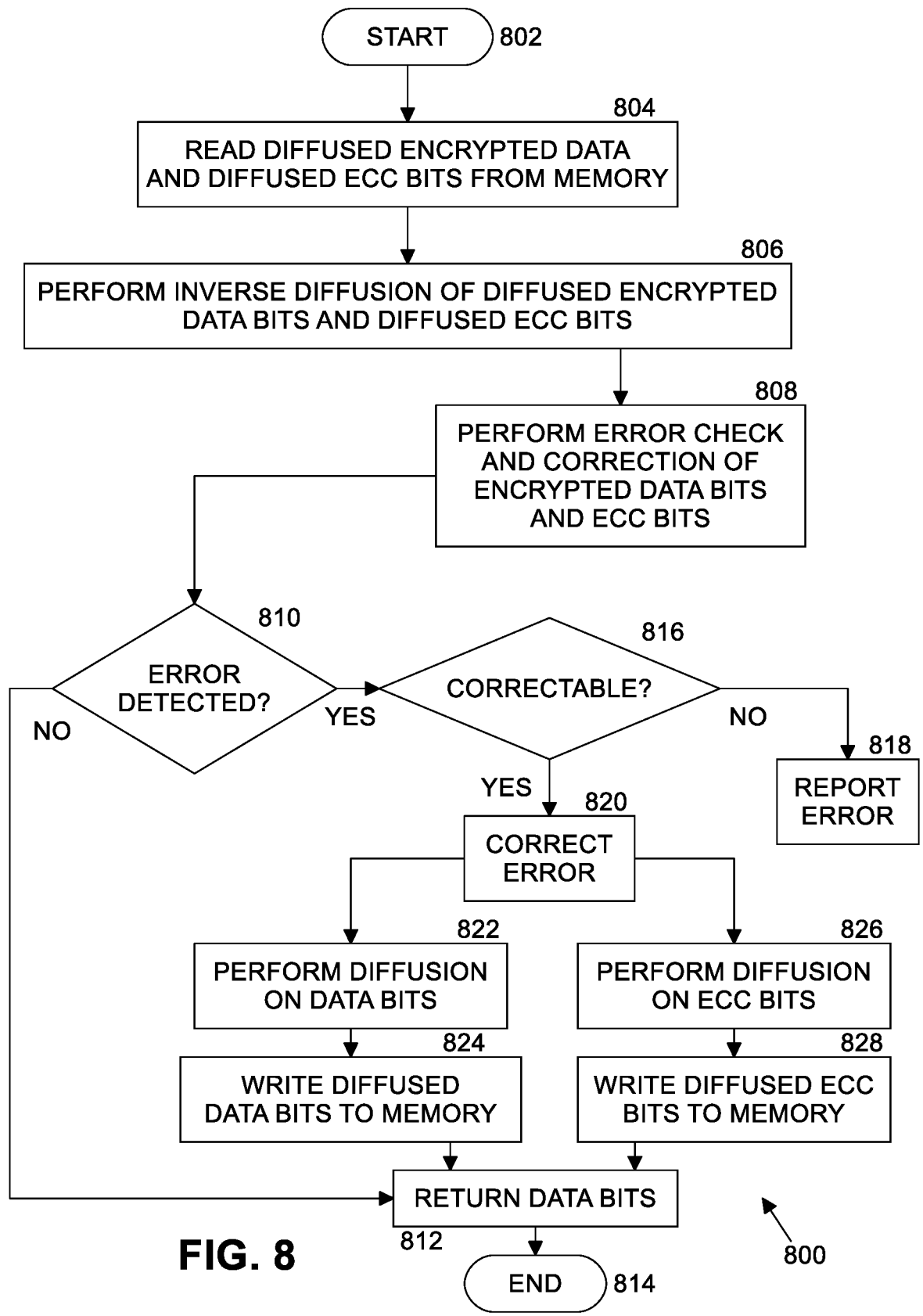
FIG. 8 is a flow diagram of "inside-out" MAGIC processing according to the first implementation.

FIG. 8 is a flow diagram of "inside-out" MAGIC processing 800 according to the first example. In this first example, the operation is a read data operation for encrypt then "inside-out" MAGIC processing. After start 802, the computing system 100 reads diffused encrypted data bits 406 and diffused ECC bits 114 from memory 116. At block 806, inverse diffusion layer circuitry 103 performs inverse diffusion processing of the diffused encrypted data bits 406 to generate encrypted data bits 404 and of diffused ECC bits 114. At block 808, ECC error check and correction circuitry 504 performs error checking and correction of the ECC bits and encrypted data bits 404. At block 810, if no error was detected during ECC error checking at block 808, then at block 812 the data bits 104 are returned (e.g., are available for further processing by the computing system 100) and speculative decryption processing ends at block 814. At block 810, if an error was detected during ECC error checking at block 808, then if the error is correctable at block 816, processing continues with block 820 where ECC error check and correction 504 corrects the error (including correcting data bits and updating the ECC bits). If the error is uncorrectable at block 816, then an error is reported at block 818. If the error is corrected at block 820, then at block 822 diffusion function circuitry 505 performs diffusion on encrypted data bits 404 and at block 824 the diffused encrypted data bits 406 are written back to memory 116. In parallel, at block 826, diffusion function circuitry 506 diffuses the updated ECC bits. At block 828, the diffused ECC bits are written back to memory 116. In both cases, the data bits are returned (e.g., the decrypted data bits 104 are available for further processing) and processing ends at block 814.

Figure 9:
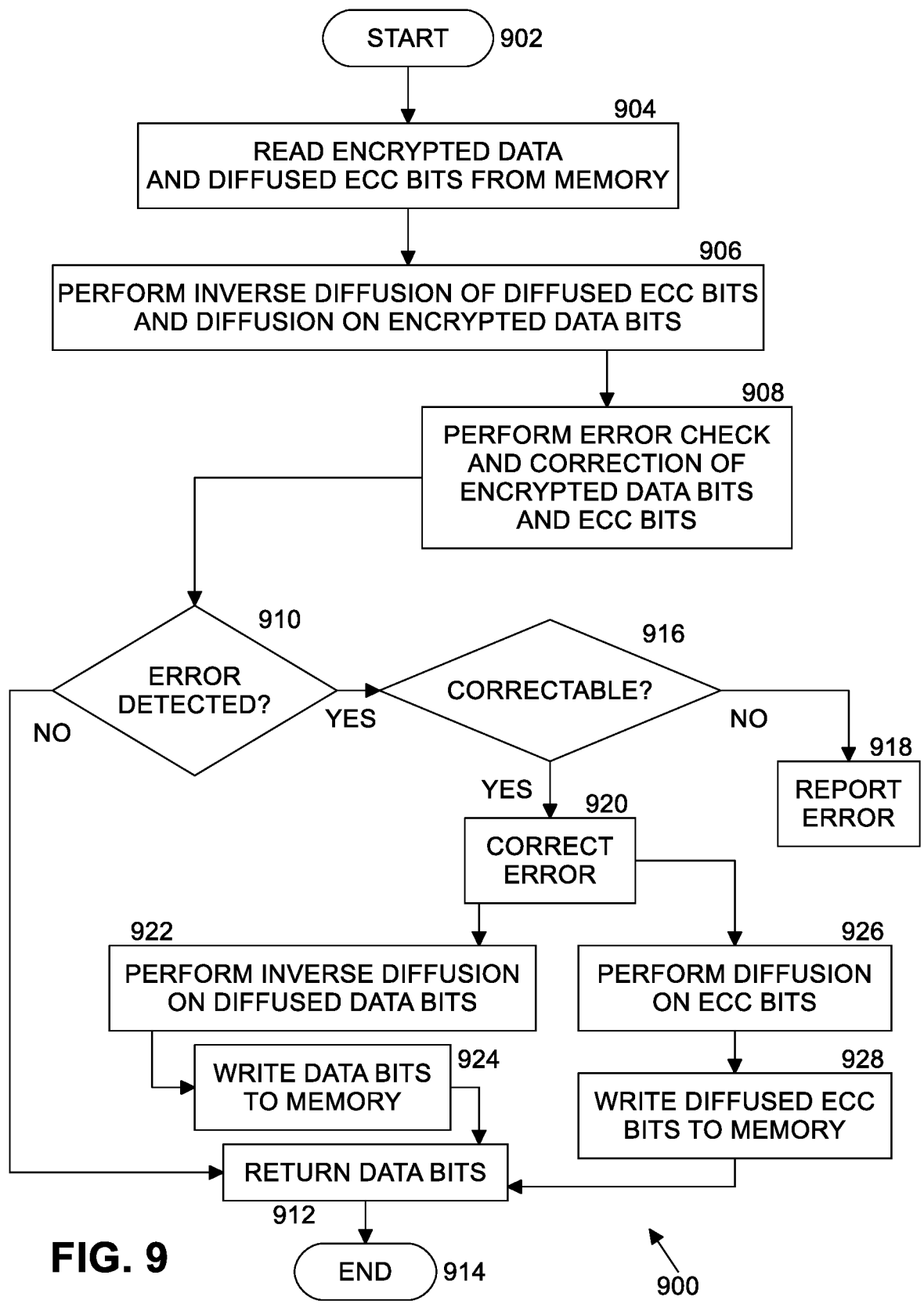
FIG. 9 is a flow diagram of "outside-in" MAGIC processing according to the second implementation.

FIG. 9 is a flow diagram of "outside-in" MAGIC processing 900 according to the second example. In this second example, the operation is a read data operation for encrypt then "outside-in" MAGIC processing. After start 902, the computing system 100 reads encrypted data bits 406 and diffused ECC bits 114 from memory 116. At block 906, diffusion and inverse diffusion layer circuitry 105 performs inverse diffusion processing of the diffused ECC bits 114 and diffusion of the encrypted data bits 404. At block 908, ECC error check and correction circuitry 504 performs error checking and correction of the ECC bits and diffused encrypted data bits 404. At block 910, if no error was detected during ECC error checking at block 908, then at block 912 the data bits 104 are returned (e.g., are made available for further processing by the computing system 100) and speculative decryption processing ends at block 814. In an implementation, the encrypted data bits are decrypted by memory decryption circuitry 502 before returning the data bits to the processor. At block 910, if an error was detected during ECC error checking at block 908, then if the error is correctable at block 916, processing continues with block 920 where ECC error check and correction 504 corrects the error (including correcting the diffused encrypted data bits and updating the ECC bits). If the error is uncorrectable at block 916, then an error is reported at block 918. If the error is corrected at block 920, then at block 922 inverse diffusion function circuitry 705 performs inverse diffusion on diffused encrypted data bits 404 and at block 924 the updated encrypted data bits 404 are written back to memory 116. In parallel, at block 926, diffusion function circuitry 506 diffuses the updated ECC bits. At block 928, the diffused ECC bits are written back to memory 116. In both cases, the data bits are returned (e.g., the decrypted data bits 104 are available for further processing) and processing ends at block 814. In an implementation, the encrypted data bits are decrypted by memory decryption circuitry 502 before returning the data bits to the processor.

With T redundant symbols, at most T/2 symbols may be located and corrected, where T is a natural number. Adding a bijective diffusion aligned with the Reed Solomon data/ECC symbols does not change this property. Reed Solomon is an example of an ECC but other ECC methods may be compatible with diffusion as shown herein.

Regrading security, the purpose of the s-bit diffusor blocks (e.g., diffusion layer circuits 110) of diffusion layer circuitry 102 is that from an adversarial perspective, changes on the input of the diffusion layer circuitry leads to changes to the output of the diffusion layer circuitry that cannot be predicted without knowing the secret key or sampling the output of the diffusion layer circuitry. A silent data corruption happens also only with a certain probability and cannot be deterministically forced by the adversary. Therefore, it is advantageous for the diffusion function circuits to use a secret key K that is randomly chosen. In addition, each $D_i^K$ has to be a different bijection, so that same inputs do not lead to same outputs. Furthermore, an attacker should not be able to read the diffused ECC bits 114 if s is small. For a small s, the full codebook for each Dr is quickly exhausted and knowing diffused ECC bits 114 and diffused data bits 112 reveals partial knowledge about this codebook via the ECC bits 114 that might be used to craft silent data corruptions.

While an example manner of implementing the technology described herein is illustrated in FIGS. 1-9, one or more of the elements, processes, and/or devices illustrated in FIGS. 1-9 may be combined, divided, re-arranged, omitted, eliminated, and/or implemented in any other way. Further, the example diffusion layer circuitry 102, 103, and 105 may be implemented by hardware, software, firmware, and/or any combination of hardware, software, and/or firmware. Thus, for example, any of the diffusion layer circuitry 102, 103, and 105 could be implemented by processor circuitry, analog circuit(s), digital circuit(s), logic circuit(s), programmable processor(s), programmable microcontroller(s), graphics processing unit(s) (GPU(s)), digital signal processor(s) (DSP(s)), application specific integrated circuit(s) (ASIC(s)), programmable logic device(s) (PLD(s)), and/or field programmable logic device(s) (FPLD(s)) such as Field Programmable Gate Arrays (FPGAs). When reading any of the apparatus or system claims of this patent to cover a purely software and/or firmware implementation, at least one of the example hardware resources is/are hereby expressly defined to include a non-transitory computer readable storage device or storage disk such as a memory, a digital versatile disk (DVD), a compact disk (CD), a Blu-ray disk, etc., including the software and/or firmware. Further still, the example circuitry of FIGS. 1-9 may include one or more elements, processes, and/or devices in addition to, or instead of, those illustrated in FIGS. 1-9, and/or may include more than one of any or all the illustrated elements, processes and devices.

Diagrams representative of example hardware logic circuitry, machine readable instructions, hardware implemented state machines, and/or any combination thereof is shown in FIGS. 1-9. The machine readable instructions may be one or more executable programs or portion(s) of an executable program for execution by processor circuitry, such as the processor circuitry 1012 shown in the example processor platform 1000 discussed below in connection with FIG. 10 and/or the example processor circuitry discussed below in connection with FIGS. 11 and/or 12. The program may be embodied in software stored on one or more non-transitory computer readable storage media such as a CD, a floppy disk, a hard disk drive (HDD), a DVD, a Blu-ray disk, a volatile memory (e.g., Random Access Memory (RAM) of any type, etc.), or a non-volatile memory (e.g., FLASH memory, an HDD, etc.) associated with processor circuitry located in one or more hardware devices, but the entire program and/or parts thereof could alternatively be executed by one or more hardware devices other than the processor circuitry and/or embodied in firmware or dedicated hardware. The tangible machine-readable instructions may be distributed across multiple hardware devices and/or executed by two or more hardware devices (e.g., a server and a client hardware device). For example, the client hardware device may be implemented by an endpoint client hardware device (e.g., a hardware device associated with a user) or an intermediate client hardware device (e.g., a radio access network (RAN) gateway that may facilitate communication between a server and an endpoint client hardware device). Similarly, the non-transitory computer readable storage media may include one or more mediums located in one or more hardware devices. Further, although the example program is described with reference to the diagrams illustrated in FIG. 1-, many other methods of implementing the example computing system may alternatively be used. For example, the order of execution of the blocks may be changed, and/or some of the blocks described may be changed, eliminated, or combined. Additionally or alternatively, any or all of the blocks may be implemented by one or more hardware circuits (e.g., processor circuitry, discrete and/or integrated analog and/or digital circuitry, an FPGA, an ASIC, a comparator, an operational-amplifier (op-amp), a logic circuit, etc.) structured to perform the corresponding operation without executing software or firmware. The processor circuitry may be distributed in different network locations and/or local to one or more hardware devices (e.g., a single-core processor (e.g., a single core central processor unit (CPU)), a multi-core processor (e.g., a multi-core CPU), etc.) in a single machine, multiple processors distributed across multiple servers of a server rack, multiple processors distributed across one or more server racks, a CPU and/or a FPGA located in the same package (e.g., the same integrated circuit (IC) package or in two or more separate housings, etc.).

The machine-readable instructions described herein may be stored in one or more of a compressed format, an encrypted format, a fragmented format, a compiled format, an executable format, a packaged format, etc. Machine readable instructions as described herein may be stored as data or a data structure (e.g., as portions of instructions, code, representations of code, etc.) that may be utilized to create, manufacture, and/or produce machine executable instructions. For example, the machine-readable instructions may be fragmented and stored on one or more storage devices and/or computing devices (e.g., servers) located at the same or different locations of a network or collection of networks (e.g., in the cloud, in edge devices, etc.). The machine-readable instructions may require one or more of installation, modification, adaptation, updating, combining, supplementing, configuring, decryption, decompression, unpacking, distribution, reassignment, compilation, etc., in order to make them directly readable, interpretable, and/or executable by a computing device and/or other machine. For example, the machine-readable instructions may be stored in multiple parts, which are individually compressed, encrypted, and/or stored on separate computing devices, wherein the parts when decrypted, decompressed, and/or combined form a set of machine executable instructions that implement one or more operations that may together form a program such as that described herein.

In another example, the machine-readable instructions may be stored in a state in which they may be read by processor circuitry, but require addition of a library (e.g., a dynamic link library (DLL)), a software development kit (SDK), an application programming interface (API), etc., in order to execute the machine-readable instructions on a particular computing device or other device. In another example, the machine-readable instructions may need to be configured (e.g., settings stored, data input, network addresses recorded, etc.) before the machine-readable instructions and/or the corresponding program(s) can be executed in whole or in part. Thus, machine readable media, as used herein, may include machine readable instructions and/or program(s) regardless of the particular format or state of the machine-readable instructions and/or program(s) when stored or otherwise at rest or in transit.

The machine-readable instructions described herein can be represented by any past, present, or future instruction language, scripting language, programming language, etc. For example, the machine-readable instructions may be represented using any of the following languages: C, C++, Java, C #, Perl, Python, JavaScript, HyperText Markup Language (HTML), Structured Query Language (SQL), Swift, etc.

As mentioned above, the example operations of FIGS. 1-9 may be implemented using executable instructions (e.g., computer and/or machine readable instructions) stored on one or more non-transitory computer and/or machine readable media such as optical storage devices, magnetic storage devices, an HDD, a flash memory, a read-only memory (ROM), a CD, a DVD, a cache, a RAM of any type, a register, and/or any other storage device or storage disk in which information is stored for any duration (e.g., for extended time periods, permanently, for brief instances, for temporarily buffering, and/or for caching of the information). As used herein, the terms non-transitory computer readable medium and non-transitory computer readable storage medium is expressly defined to include any type of computer readable storage device and/or storage disk and to exclude propagating signals and to exclude transmission media.

"Including" and "comprising" (and all forms and tenses thereof) are used herein to be open ended terms. Thus, whenever a claim employs any form of "include" or "comprise" (e.g., comprises, includes, comprising, including, having, etc.) as a preamble or within a claim recitation of any kind, it is to be understood that additional elements, terms, etc., may be present without falling outside the scope of the corresponding claim or recitation. As used herein, when the phrase "at least" is used as the transition term in, for example, a preamble of a claim, it is open-ended in the same manner as the term "comprising" and "including" are open ended. The term "and/or" when used, for example, in a form such as A, B, and/or C refers to any combination or subset of A, B, C such as (1) A alone, (2) B alone, (3) C alone, (4) A with B, (5) A with C, (6) B with C, or (7) A with B and with C. As used herein in the context of describing structures, components, items, objects and/or things, the phrase "at least one of A and B" is intended to refer to implementations including any of (1) at least one A, (2) at least one B, or (3) at least one A and at least one B. Similarly, as used herein in the context of describing structures, components, items, objects and/or things, the phrase "at least one of A or B" is intended to refer to implementations including any of (1) at least one A, (2) at least one B, or (3) at least one A and at least one B. As used herein in the context of describing the performance or execution of processes, instructions, actions, activities and/or steps, the phrase "at least one of A and B" is intended to refer to implementations including any of (1) at least one A, (2) at least one B, or (3) at least one A and at least one B. Similarly, as used herein in the context of describing the performance or execution of processes, instructions, actions, activities and/or steps, the phrase "at least one of A or B" is intended to refer to implementations including any of (1) at least one A, (2) at least one B, or (3) at least one A and at least one B.

As used herein, singular references (e.g., "a", "an", "first", "second", etc.) do not exclude a plurality. The term "a" or "an" object, as used herein, refers to one or more of that object. The terms "a" (or "an"), "one or more", and "at least one" are used interchangeably herein. Furthermore, although individually listed, a plurality of means, elements or method actions may be implemented by, e.g., the same entity or object. Additionally, although individual features may be included in different examples or claims, these may possibly be combined, and the inclusion in different examples or claims does not imply that a combination of features is not feasible and/or advantageous.

Figure 10:
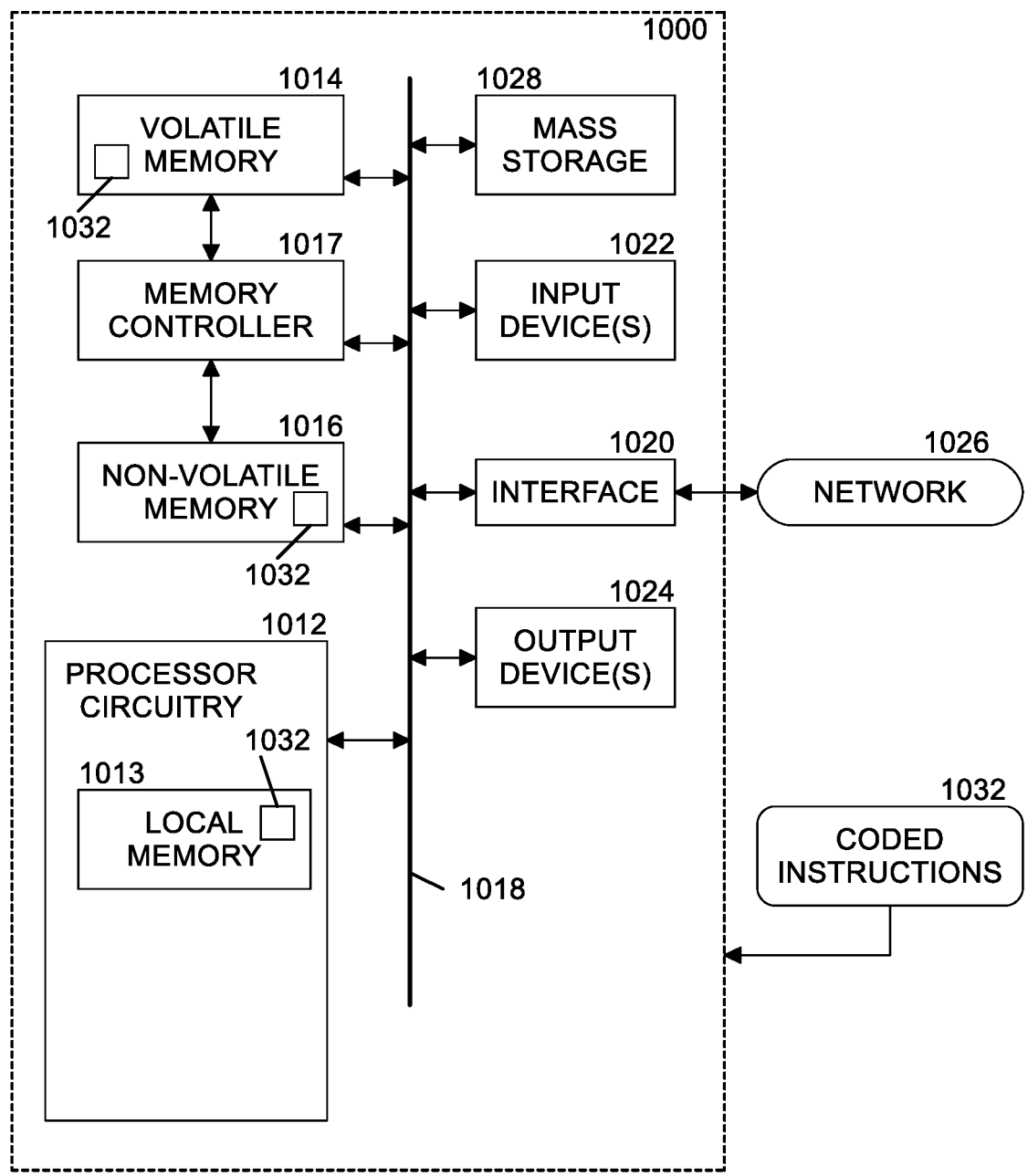
FIG. 10 is a block diagram of an example processor platform structured to execute and/or instantiate the machine-readable instructions and/or operations of FIGS. 1-9 to implement the apparatus discussed with reference to FIGS. 1-9.

FIG. 10 is a block diagram of an example processor platform 1000 structured to execute and/or instantiate the machine-readable instructions and/or operations of FIGS. 1-9. The processor platform 1000 can be, for example, a server, a personal computer, a workstation, a self-learning machine (e.g., a neural network), a mobile device (e.g., a cell phone, a smart phone, a tablet such as an iPad™), a personal digital assistant (PDA), an Internet appliance, a DVD player, a CD player, a digital video recorder, a Blu-ray player, a gaming console, a personal video recorder, a set top box, a headset (e.g., an augmented reality (AR) headset, a virtual reality (VR) headset, etc.) or other wearable device, or any other type of computing device.

The processor platform 1000 of the illustrated example includes processor circuitry 1012. The processor circuitry 1012 of the illustrated example is hardware. For example, the processor circuitry 1012 can be implemented by one or more integrated circuits, logic circuits, FPGAs microprocessors, CPUs, GPUs, DSPs, and/or microcontrollers from any desired family or manufacturer. The processor circuitry 1012 may be implemented by one or more semiconductor based (e.g., silicon based) devices. In this example, the processor circuitry 1012 implements the example processor circuitry 122.

The processor circuitry 1012 of the illustrated example includes a local memory 1013 (e.g., a cache, registers, etc.). The processor circuitry 1012 of the illustrated example is in communication with a main memory including a volatile memory 1014 and a non-volatile memory 1016 by a bus 1018. The volatile memory 1014 may be implemented by Synchronous Dynamic Random Access Memory (SDRAM), Dynamic Random Access Memory (DRAM), RAMBUS® Dynamic Random Access Memory (RDRAM®), and/or any other type of RAM device. The non-volatile memory 1016 may be implemented by flash memory and/or any other desired type of memory device. Access to the main memory 1014, 1016 of the illustrated example is controlled by a memory controller 1017.

The processor platform 1000 of the illustrated example also includes interface circuitry 1020. The interface circuitry 1020 may be implemented by hardware in accordance with any type of interface standard, such as an Ethernet interface, a universal serial bus (USB) interface, a Bluetooth® interface, a near field communication (NFC) interface, a PCI interface, and/or a PCIe interface.

In the illustrated example, one or more input devices 1022 are connected to the interface circuitry 1020. The input device(s) 1022 permit(s) a user to enter data and/or commands into the processor circuitry 1012. The input device(s) 1022 can be implemented by, for example, an audio sensor, a microphone, a camera (still or video), a keyboard, a button, a mouse, a touchscreen, a trackpad, a trackball, an isopoint device, and/or a voice recognition system.

One or more output devices 1024 are also connected to the interface circuitry 1020 of the illustrated example. The output devices 1024 can be implemented, for example, by display devices (e.g., a light emitting diode (LED), an organic light emitting diode (OLED), a liquid crystal display (LCD), a cathode ray tube (CRT) display, an in-place switching (IPS) display, a touchscreen, etc.), a tactile output device, a printer, and/or speaker. The interface circuitry 1020 of the illustrated example, thus, typically includes a graphics driver card, a graphics driver chip, and/or graphics processor circuitry such as a GPU.

The interface circuitry 1020 of the illustrated example also includes a communication device such as a transmitter, a receiver, a transceiver, a modem, a residential gateway, a wireless access point, and/or a network interface to facilitate exchange of data with external machines (e.g., computing devices of any kind) by a network 1026. The communication can be by, for example, an Ethernet connection, a digital subscriber line (DSL) connection, a telephone line connection, a coaxial cable system, a satellite system, a line-of-site wireless system, a cellular telephone system, an optical connection, etc.

The processor platform 1000 of the illustrated example also includes one or more mass storage devices 1028 to store software and/or data. Examples of such mass storage devices 1028 include magnetic storage devices, optical storage devices, floppy disk drives, HDDs, CDs, Blu-ray disk drives, redundant array of independent disks (RAID) systems, solid state storage devices such as flash memory devices, and DVD drives.

The machine executable instructions 1032, which may be implemented by the machine-readable instructions of FIGS. 1-9, may be stored in the mass storage device 1028, in the volatile memory 1014, in the non-volatile memory 1016, and/or on a removable non-transitory computer readable storage medium such as a CD or DVD.

Figure 11:
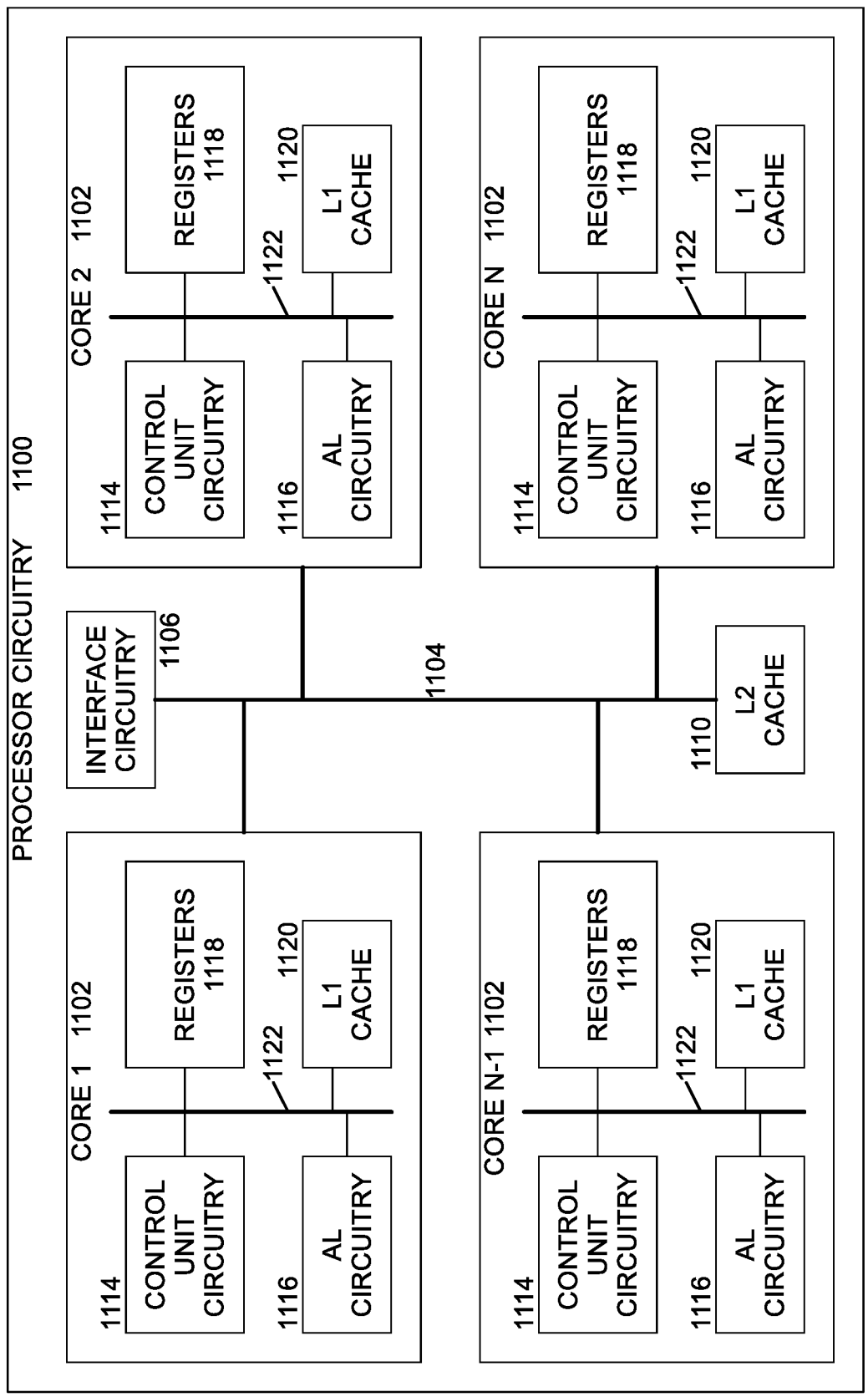
FIG. 11 is a block diagram of an example implementation of the processor circuitry of FIG. 10.

FIG. 11 is a block diagram of an example implementation of the processor circuitry 1012 of FIG. 10. In this example, the processor circuitry 1012 of FIG. 11 is implemented by a microprocessor 1100. For example, the microprocessor 1100 may implement multi-core hardware circuitry such as a CPU, a DSP, a GPU, an XPU, etc. Although it may include any number of example cores 1102 (e.g., 1 core), the microprocessor 1100 of this example is a multi-core semiconductor device including N cores. The cores 1102 of the microprocessor 1100 may operate independently or may cooperate to execute machine readable instructions. For example, machine code corresponding to a firmware program, an embedded software program, or a software program may be executed by one of the cores 1102 or may be executed by multiple ones of the cores 1102 at the same or different times. In some examples, the machine code corresponding to the firmware program, the embedded software program, or the software program is split into threads and executed in parallel by two or more of the cores 1102. The software program may correspond to a portion or all the machine-readable instructions and/or operations represented by the diagrams of FIGS. 1-9.

The cores 1102 may communicate by an example bus 1104. In some examples, the bus 1104 may implement a communication bus to effectuate communication associated with one(s) of the cores 1102. For example, the bus 1104 may implement at least one of an Inter-Integrated Circuit (I2C) bus, a Serial Peripheral Interface (SPI) bus, a PCI bus, or a PCIe bus. Additionally or alternatively, the bus 1104 may implement any other type of computing or electrical bus. The cores 1102 may obtain data, instructions, and/or signals from one or more external devices by example interface circuitry 1106. The cores 1102 may output data, instructions, and/or signals to the one or more external devices by the interface circuitry 1106. Although the cores 1102 of this example include example local memory 1120 (e.g., Level 1 (L1) cache that may be split into an L1 data cache and an L1 instruction cache), the microprocessor 1100 also includes example shared memory 1110 that may be shared by the cores (e.g., Level 2 (L2_cache)) for high-speed access to data and/or instructions. Data and/or instructions may be transferred (e.g., shared) by writing to and/or reading from the shared memory 1110. The local memory 1120 of each of the cores 1102 and the shared memory 1110 may be part of a hierarchy of storage devices including multiple levels of cache memory and the main memory (e.g., the main memory 1014, 1016 of FIG. 10). Typically, higher levels of memory in the hierarchy exhibit lower access time and have smaller storage capacity than lower levels of memory. Changes in the various levels of the cache hierarchy are managed (e.g., coordinated) by a cache coherency policy.

Each core 1102 may be referred to as a CPU, DSP, GPU, etc., or any other type of hardware circuitry. Each core 1102 includes control unit circuitry 1114, arithmetic and logic (AL) circuitry (sometimes referred to as an ALU) 1116, a plurality of registers 1118, the L1 cache in local memory 1120, and an example bus 1122. Other structures may be present. For example, each core 1102 may include vector unit circuitry, single instruction multiple data (SIMD) unit circuitry, load/store unit (LSU) circuitry, branch/jump unit circuitry, floating-point unit (FPU) circuitry, etc. The control unit circuitry 1114 includes semiconductor-based circuits structured to control (e.g., coordinate) data movement within the corresponding core 1102. The AL circuitry 1116 includes semiconductor-based circuits structured to perform one or more mathematic and/or logic operations on the data within the corresponding core 1102. The AL circuitry 1116 of some examples performs integer-based operations. In other examples, the AL circuitry 1116 also performs floating point operations. In yet other examples, the AL circuitry 1116 may include first AL circuitry that performs integer-based operations and second AL circuitry that performs floating point operations. In some examples, the AL circuitry 1116 may be referred to as an Arithmetic Logic Unit (ALU). The registers 1118 are semiconductor-based structures to store data and/or instructions such as results of one or more of the operations performed by the AL circuitry 1116 of the corresponding core 1102. For example, the registers 1118 may include vector register(s), SIMD register(s), general purpose register(s), flag register(s), segment register(s), machine specific register(s), instruction pointer register(s), control register(s), debug register(s), memory management register(s), machine check register(s), etc. The registers 1118 may be arranged in a bank as shown in FIG. 11. Alternatively, the registers 1118 may be organized in any other arrangement, format, or structure including distributed throughout the core 1102 to shorten access time. The bus 1104 may implement at least one of an I2C bus, a SPI bus, a PCI bus, or a PCIe bus.

Each core 1102 and/or, more generally, the microprocessor 1100 may include additional and/or alternate structures to those shown and described above. For example, one or more clock circuits, one or more power supplies, one or more power gates, one or more cache home agents (CHAs), one or more converged/common mesh stops (CMS s), one or more shifters (e.g., barrel shifter(s)) and/or other circuitry may be present. The microprocessor 1100 is a semiconductor device fabricated to include many transistors interconnected to implement the structures described above in one or more integrated circuits (ICs) contained in one or more packages. The processor circuitry may include and/or cooperate with one or more accelerators. In some examples, accelerators are implemented by logic circuitry to perform certain tasks more quickly and/or efficiently than can be done by a general-purpose processor. Examples of accelerators include ASICs and FPGAs such as those discussed herein. A GPU or other programmable device can also be an accelerator. Accelerators may be on-board the processor circuitry, in the same chip package as the processor circuitry and/or in one or more separate packages from the processor circuitry.

Figure 12:
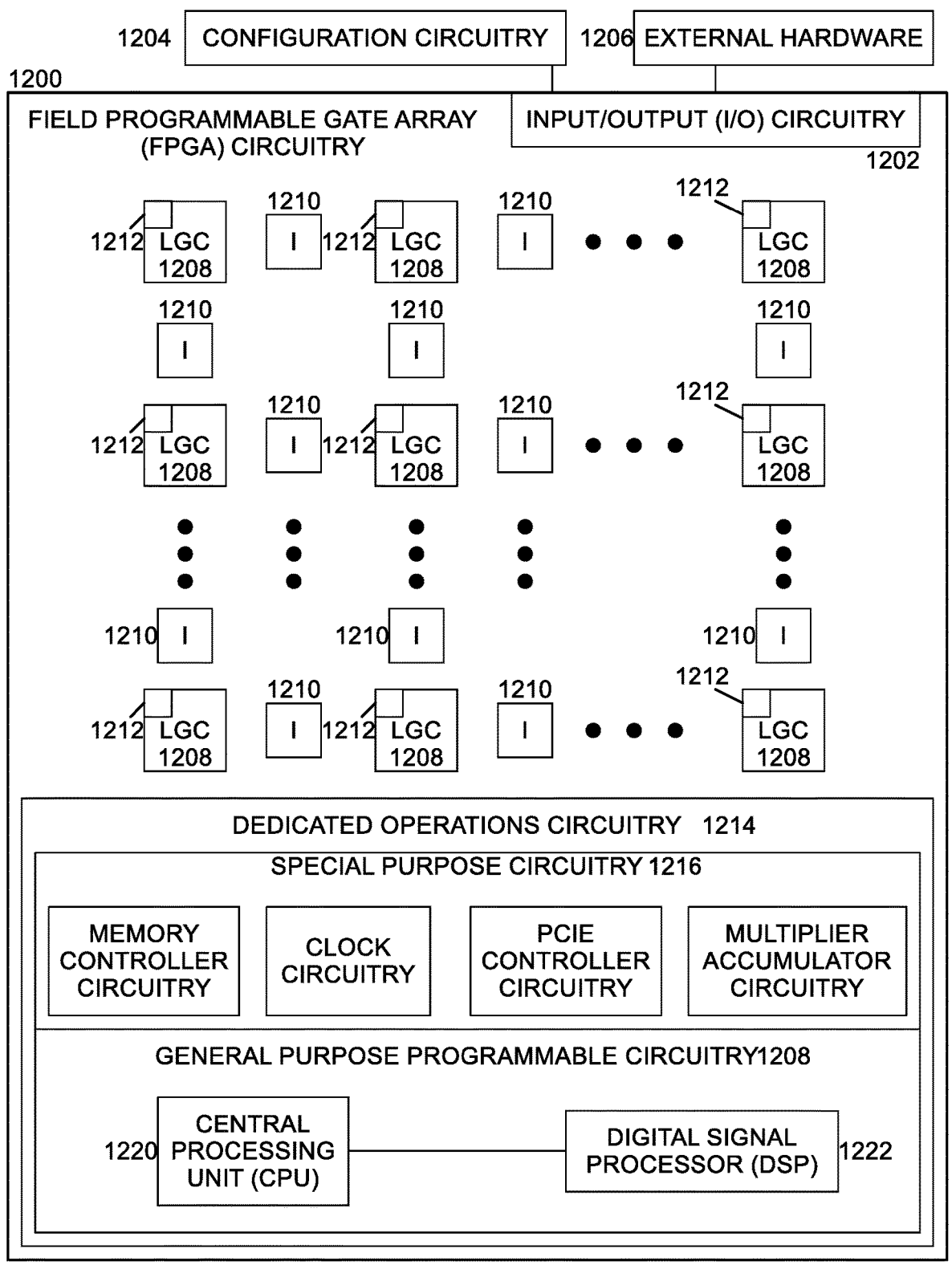
FIG. 12 is a block diagram of another example implementation of the processor circuitry of FIG. 10.

FIG. 12 is a block diagram of another example implementation of the processor circuitry 1012 of FIG. 10. In this example, the processor circuitry 1012 is implemented by FPGA circuitry 1200. The FPGA circuitry 1200 can be used, for example, to perform operations that could otherwise be performed by the example microprocessor 1100 of FIG. 11 executing corresponding machine-readable instructions. However, once configured, the FPGA circuitry 1200 instantiates the machine-readable instructions in hardware and, thus, can often execute the operations faster than they could be performed by a general purpose microprocessor executing the corresponding software.

More specifically, in contrast to the microprocessor 1100 of FIG. 11 described above (which is a general purpose device that may be programmed to execute some or all of the machine readable instructions represented by the diagrams of FIGS. 1-9 but whose interconnections and logic circuitry are fixed once fabricated), the FPGA circuitry 1200 of the example of FIG. 12 includes interconnections and logic circuitry that may be configured and/or interconnected in different ways after fabrication to instantiate, for example, some or all of the machine readable instructions represented by the diagrams of FIGS. 1-9. In particular, the FPGA 1200 may be thought of as an array of logic gates, interconnections, and switches. The switches can be programmed to change how the logic gates are interconnected by the interconnections, effectively forming one or more dedicated logic circuits (unless and until the FPGA circuitry 1200 is reprogrammed). The configured logic circuits enable the logic gates to cooperate in different ways to perform different operations on data received by input circuitry. Those operations may correspond to some or all of the software represented by the diagrams of FIGS. 1-9. As such, the FPGA circuitry 1200 may be structured to effectively instantiate some or all the machine-readable instructions of the diagrams of FIGS. 1-9 as dedicated logic circuits to perform the operations corresponding to those software instructions in a dedicated manner analogous to an ASIC. Therefore, the FPGA circuitry 1200 may perform the operations corresponding to the some or all of the machine-readable instructions of FIGS. 1-9 faster than the general-purpose microprocessor can execute the same.

In the example of FIG. 12, the FPGA circuitry 1200 is structured to be programmed (and/or reprogrammed one or more times) by an end user by a hardware description language (HDL) such as Verilog. The FPGA circuitry 1200 of FIG. 12, includes example input/output (I/O) circuitry 1202 to obtain and/or output data to/from example configuration circuitry 1204 and/or external hardware (e.g., external hardware circuitry) 1206. For example, the configuration circuitry 1204 may implement interface circuitry that may obtain machine readable instructions to configure the FPGA circuitry 1200, or portion(s) thereof. In some such examples, the configuration circuitry 1204 may obtain the machine-readable instructions from a user, a machine (e.g., hardware circuitry (e.g., programmed or dedicated circuitry) that may implement an Artificial Intelligence/Machine Learning (AI/ML) model to generate the instructions), etc. In some examples, the external hardware 1206 may implement the microprocessor 1100 of FIG. 11. The FPGA circuitry 1200 also includes an array of example logic gate circuitry 1208, a plurality of example configurable interconnections 1210, and example storage circuitry 1212. The logic gate circuitry 1208 and interconnections 1210 are configurable to instantiate one or more operations that may correspond to at least some of the machine-readable instructions of FIGS. 1-9 and/or other desired operations. The logic gate circuitry 1208 shown in FIG. 12 is fabricated in groups or blocks. Each block includes semiconductor-based electrical structures that may be configured into logic circuits. In some examples, the electrical structures include logic gates (e.g., And gates, Or gates, Nor gates, etc.) that provide basic building blocks for logic circuits. Electrically controllable switches (e.g., transistors) are present within each of the logic gate circuitry 1208 to enable configuration of the electrical structures and/or the logic gates to form circuits to perform desired operations. The logic gate circuitry 1208 may include other electrical structures such as look-up tables (LUTs), registers (e.g., flip-flops or latches), multiplexers, etc.

The interconnections 1210 of the illustrated example are conductive pathways, traces, vias, or the like that may include electrically controllable switches (e.g., transistors) whose state can be changed by programming (e.g., using an HDL instruction language) to activate or deactivate one or more connections between one or more of the logic gate circuitry 1208 to program desired logic circuits.

The storage circuitry 1212 of the illustrated example is structured to store result(s) of the one or more of the operations performed by corresponding logic gates. The storage circuitry 1212 may be implemented by registers or the like. In the illustrated example, the storage circuitry 1212 is distributed amongst the logic gate circuitry 1208 to facilitate access and increase execution speed.

The example FPGA circuitry 1200 of FIG. 12 also includes example Dedicated Operations Circuitry 1214. In this example, the Dedicated Operations Circuitry 1214 includes special purpose circuitry 1216 that may be invoked to implement commonly used functions to avoid the need to program those functions in the field. Examples of such special purpose circuitry 1216 include memory (e.g., DRAM) controller circuitry, PCIe controller circuitry, clock circuitry, transceiver circuitry, memory, and multiplier-accumulator circuitry. Other types of special purpose circuitry may be present. In some examples, the FPGA circuitry 1200 may also include example general purpose programmable circuitry 1218 such as an example CPU 1220 and/or an example DSP 1222. Other general purpose programmable circuitry 1218 may additionally or alternatively be present such as a GPU, an XPU, etc., that can be programmed to perform other operations.

Although FIGS. 11 and 12 illustrate two example implementations of the processor circuitry 1012 of FIG. 10, many other approaches are contemplated. For example, as mentioned above, modern FPGA circuitry may include an on-board CPU, such as one or more of the example CPU 1220 of FIG. 12. Therefore, the processor circuitry 1012 of FIG. 10 may additionally be implemented by combining the example microprocessor 1100 of FIG. 11 and the example FPGA circuitry 1200 of FIG. 12. In some such hybrid examples, a first portion of the machine-readable instructions represented by the diagrams of FIGS. 1-9 may be executed by one or more of the cores 1102 of FIG. 11 and a second portion of the machine-readable instructions represented by the diagrams of FIGS. 1-9 may be executed by the FPGA circuitry 1200 of FIG. 12.

In some examples, the processor circuitry 1012 of FIG. 10 may be in one or more packages. For example, the processor circuitry 1100 of FIG. 11 and/or the FPGA circuitry 1200 of FIG. 12 may be in one or more packages. In some examples, an XPU may be implemented by the processor circuitry 1012 of FIG. 10, which may be in one or more packages. For example, the XPU may include a CPU in one package, a DSP in another package, a GPU in yet another package, and an FPGA in still yet another package.

Figure 13:
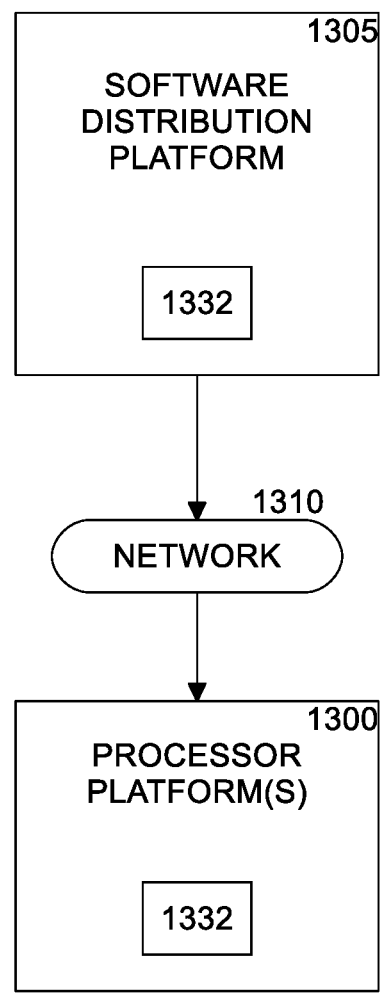
FIG. 13 is a block diagram illustrating an example software distribution platform to distribute software such as the example machine readable instructions of FIG. 10 to hardware devices owned and/or operated by third parties.

A block diagram illustrating an example software distribution platform 1305 to distribute software such as the example machine readable instructions 1032 of FIG. 10 to hardware devices owned and/or operated by third parties is illustrated in FIG. 13. The example software distribution platform 1305 may be implemented by any computer server, data facility, cloud service, etc., capable of storing and transmitting software to other computing devices. The third parties may be customers of the entity owning and/or operating the software distribution platform 1305. For example, the entity that owns and/or operates the software distribution platform 1305 may be a developer, a seller, and/or a licensor of software such as the example machine readable instructions 1032 of FIG. 10. The third parties may be consumers, users, retailers, OEMs, etc., who purchase and/or license the software for use and/or re-sale and/or sub-licensing. In the illustrated example, the software distribution platform 1305 includes one or more servers and one or more storage devices. The storage devices store the machine-readable instructions 1032, which may correspond to the example machine readable instructions, as described above. The one or more servers of the example software distribution platform 1305 are in communication with a network 1310, which may correspond to any one or more of the Internet and/or any of the example networks, etc., described above. In some examples, the one or more servers are responsive to requests to transmit the software to a requesting party as part of a commercial transaction. Payment for the delivery, sale, and/or license of the software may be handled by the one or more servers of the software distribution platform and/or by a third-party payment entity. The servers enable purchasers and/or licensors to download the machine-readable instructions 1032 from the software distribution platform 1305. For example, the software, which may correspond to the example machine readable instructions described above, may be downloaded to the example processor platform 1300, which is to execute the machine-readable instructions 1032 to implement the methods described above and associated computing system 200. In some examples, one or more servers of the software distribution platform 1305 periodically offer, transmit, and/or force updates to the software (e.g., the example machine readable instructions 1032 of FIG. 10) to ensure improvements, patches, updates, etc., are distributed and applied to the software at the end user devices.

In some examples, an apparatus includes means for data processing of FIGS. 1-9. For example, the means for processing may be implemented by processor circuitry, processor circuitry, firmware circuitry, other circuitry, etc. In some examples, the processor circuitry may be implemented by machine executable instructions executed by processor circuitry, which may be implemented by the example processor circuitry 1012 of FIG. 10, the example processor circuitry 1100 of FIG. 11, and/or the example Field Programmable Gate Array (FPGA) circuitry 1200 of FIG. 12. In other examples, the processor circuitry is implemented by other hardware logic circuitry, hardware implemented state machines, and/or any other combination of hardware, software, and/or firmware. For example, the processor circuitry may be implemented by at least one or more hardware circuits (e.g., processor circuitry, discrete and/or integrated analog and/or digital circuitry, an FPGA, an Application Specific Integrated Circuit (ASIC), a comparator, an operational-amplifier (op-amp), a logic circuit, etc.) structured to perform the corresponding operation without executing software or firmware, but other structures are likewise appropriate.

From the foregoing, it will be appreciated that example systems, methods, apparatus, and articles of manufacture have been disclosed that provide improved row hammer attack mitigation. The disclosed systems, methods, apparatus, and articles of manufacture improve the security of using a computing device by improving mitigation methods of responding to row hammer attacks. The disclosed systems, methods, apparatus, and articles of manufacture are accordingly directed to one or more improvement(s) in the operation of a machine such as a computer or other electronic and/or mechanical device.

The following examples pertain to further embodiments. Specifics in the examples may be used anywhere in one or more embodiments. Example 1 is an apparatus including a first plurality of bijection diffusion function circuits to diffuse data bits into diffused data bits and store the diffused data bits into a memory; an error correcting code (ECC) generation circuit to generate ECC bits for the data bits; and a second plurality of bijection diffusion function circuits to diffuse the ECC bits into diffused ECC bits and store the diffused ECC bits into the memory.

In Example 2, the subject matter of Example 1 optionally includes wherein the data bits are divided into a plurality of s-bit blocks of data bits, and a bijection diffusion function circuit of the first plurality of bijection diffusion function circuits is applied to one of the plurality of s-bit blocks of data bits to generate an s-bit block of the diffused data bits. In Example 3, the subject matter of Example 1 optionally includes wherein the ECC bits are divided into a plurality of s-bit blocks of ECC bits, and a bijection diffusion function circuit of the second plurality of bijection diffusion function circuits is applied to one of the plurality of s-bit blocks of ECC bits to generate an s-bit block of the diffused ECC bits. In Example 4, the subject matter of Example 1 optionally includes wherein all the first plurality of bijection diffusion function circuits are instances of a same bijection diffusion function circuit. In Example 5, the subject matter of Example 1 optionally includes wherein at least one of the first plurality of bijection diffusion function circuits is different than other ones of the first plurality of bijection diffusion function circuits. In Example 6, the subject matter of Example 1 optionally includes wherein at least one of the first plurality of bijection diffusion function circuits uses an index of the at least one of the first plurality of bijection diffusion function circuits as an input tweak to ensure that diffused data bits output from the at least one of the first plurality of bijection diffusion function circuits are not correlated to diffused data bits output from other ones of the first plurality of bijection diffusion function circuits.

In Example 7, the subject matter of Example 1 optionally includes wherein at least one of the first plurality of bijection diffusion function circuits and the second plurality of bijection diffusion function circuits comprise s-bit block ciphers. In Example 8, the subject matter of Example 1 optionally includes memory encryption circuitry to encrypt the data bits into encrypted data bits, the first plurality of bijection diffusion function circuits is to diffuse the encrypted data bits into diffused encrypted data bits and store the diffused encrypted data bits into the memory, and the ECC generation circuit is to generate ECC bits for the encrypted data bits. In Example 9, the subject matter of Example 1 optionally includes wherein the first plurality of bijection diffusion function circuits is to diffuse, in parallel, the data bits into diffused data bits and store the diffused data bits and the second plurality of bijection diffusion function circuits is to diffuse, in parallel, the ECC bits into the diffused ECC bits.

Example 10 is a method including diffusing data bits into diffused data bits; storing the diffused data bits into a memory; generating error correcting code (ECC) bits for the data bits; diffusing the ECC bits into diffused ECC bits; and storing the diffused ECC bits into the memory. In Example 11, the subject matter of Example 10 optionally includes wherein the data bits are divided into a plurality of s-bit blocks of data bits and diffusing the data bits into the diffused data bits comprises diffusing one of the plurality of s-bit blocks of data bits to generate an s-bit block of the diffused data bits. In Example 12, the subject matter of Example 11 optionally includes wherein diffusing the data bits into diffused data bits comprises diffusing data bits of all the plurality of s-bit blocks according to a same bijection diffusion function. In Example 13, the subject matter of Example 11 optionally includes wherein diffusing the data bits into diffused data bits comprises diffusing data bits of at least one of the plurality of s-bit blocks according to a different bijection diffusion function than diffusing data bits of other ones of the plurality of s-bit blocks. In Example 14, the subject matter of Example 10 optionally includes wherein the ECC bits are divided into a plurality of s-bit blocks of ECC bits and diffusing the ECC bits into the diffused ECC bits comprises diffusing one of the plurality of s-bit blocks of ECC bits to generate an s-bit block of the diffused ECC bits. In Example 15, the subject matter of Example 11 optionally includes diffusing the data bits into diffusing data bits by applying a bijection diffusion function to the data bits. In Example 16, the subject matter of Example 15 optionally includes wherein the bijection diffusion function comprises an s-bit block cipher. In Example 17, the subject matter of Example 10 optionally includes encrypting the data bits before diffusing the data bits into diffused data bits.

Example 18 is a system including a memory; a processor; a first plurality of bijection diffusion function circuits to receive data bits from the processor, diffuse the data bits into diffused data bits and store the diffused data bits into the memory; an error correcting code (ECC) generation circuit to generate ECC bits for the data bits; and a second plurality of bijection diffusion function circuits to diffuse the ECC bits into diffused ECC bits and store the diffused ECC bits into the memory. In Example 19, the subject matter of Example 18 optionally includes wherein at least one of the first plurality of bijection diffusion function circuits and the second plurality of bijection diffusion function circuits comprise s-bit block ciphers. In Example 20, the subject matter of Example 19 optionally includes memory encryption circuitry to receive the data bits from the processor, encrypt the data bits into encrypted data bits, and the first plurality of bijection diffusion function circuits is to diffuse the encrypted data bits into diffused encrypted data bits and store the diffused encrypted data bits into the memory, and the ECC generation circuit is to generate ECC bits for the encrypted data bits.

Example 21 is an apparatus operative to perform the method of any one of Examples 10 to 17. Example 22 is an apparatus that includes means for performing the method of any one of Examples 10 to 17. Example 23 is an apparatus that includes any combination of modules and/or units and/or logic and/or circuitry and/or means operative to perform the method of any one of Examples 10 to 17. Example 24 is an optionally non-transitory and/or tangible machine-readable medium, which optionally stores or otherwise provides instructions that if and/or when executed by a computer system or other machine are operative to cause the machine to perform the method of any one of Examples 10 to 17.

Although certain example systems, methods, apparatus, and articles of manufacture have been disclosed herein, the scope of coverage of this patent is not limited thereto. On the contrary, this patent covers all systems, methods, apparatus, and articles of manufacture fairly falling within the scope of the examples of this patent.

What is claimed is:

1. An apparatus comprising:
  a first plurality of bijection diffusion function circuits to diffuse data bits into diffused data bits and store the diffused data bits into a memory;
  an error correcting code (ECC) generation circuit to generate ECC bits for the data bits; and
  a second plurality of bijection diffusion function circuits to diffuse the ECC bits into diffused ECC bits and store the diffused ECC bits into the memory.

2. The apparatus of claim 1, wherein the data bits are divided into a plurality of s-bit blocks of data bits, and a bijection diffusion function circuit of the first plurality of bijection diffusion function circuits is to be applied to one of the plurality of s-bit blocks of data bits to generate an s-bit block of the diffused data bits.

3. The apparatus of claim 1, wherein the ECC bits are divided into a plurality of s-bit blocks of ECC bits, and a bijection diffusion function circuit of the second plurality of bijection diffusion function circuits is to be applied to one of the plurality of s-bit blocks of ECC bits to generate an s-bit block of the diffused ECC bits.

4. The apparatus of claim 1, wherein all the first plurality of bijection diffusion function circuits are instances of a same bijection diffusion function circuit.

5. The apparatus of claim 1, wherein at least one of the first plurality of bijection diffusion function circuits is different than other ones of the first plurality of bijection diffusion function circuits.

6. The apparatus of claim 1, wherein at least one of the first plurality of bijection diffusion function circuits is to use an index of the at least one of the first plurality of bijection diffusion function circuits as an input tweak to decorrelate diffused data bits output from the at least one of the first plurality of bijection diffusion function circuits from diffused data bits output from other ones of the first plurality of bijection diffusion function circuits.

7. The apparatus of claim 1, wherein at least one of the first plurality of bijection diffusion function circuits and the second plurality of bijection diffusion function circuits comprises an s-bit block cipher.

8. The apparatus of claim 1, wherein the data bits are encrypted data bits, and further comprising memory encryption circuitry to encrypt other data bits into the encrypted data bits.

9. The apparatus of claim 1, wherein the first plurality of bijection diffusion function circuits is to diffuse, in parallel, the data bits into the diffused data bits and store the diffused data bits and the second plurality of bijection diffusion function circuits is to diffuse, in parallel, the ECC bits into the diffused ECC bits.

10. The apparatus of claim 1, wherein the ECC bits are to be used to correct one or more errors in the data bits.

11. A method comprising:
    diffusing data bits into diffused data bits;
    storing the diffused data bits into a memory;
    generating error correcting code (ECC) bits for the data bits;
    diffusing the ECC bits into diffused ECC bits; and
    storing the diffused ECC bits into the memory.

12. The method of claim 11, wherein the data bits are divided into a plurality of s-bit blocks of data bits and diffusing the data bits into the diffused data bits comprises diffusing one of the plurality of s-bit blocks of data bits to generate an s-bit block of the diffused data bits.

13. The method of claim 12, wherein diffusing the data bits into the diffused data bits comprises diffusing data bits of all the plurality of s-bit blocks according to a same bijection diffusion function.

14. The method of claim 12, wherein diffusing the data bits into the diffused data bits comprises diffusing data bits of at least one of the plurality of s-bit blocks according to a different bijection diffusion function than diffusing data bits of other ones of the plurality of s-bit blocks.

15. The method of claim 12, wherein diffusing comprises diffusing the data bits into the diffused data bits by applying a bijection diffusion function to the data bits.

16. The method of claim 11, wherein the ECC bits are divided into a plurality of s-bit blocks of ECC bits and diffusing the ECC bits into the diffused ECC bits comprises diffusing one of the plurality of s-bit blocks of ECC bits to generate an s-bit block of the diffused ECC bits.

17. The method of claim 11, wherein the data bits are encrypted data bits, and further comprising encrypting other data bits to generate the encrypted data bits before diffusing the data bits into diffused data bits.

18. The method of claim 11, comprising using the ECC bits to correct at least one error in the data bits.

19. A system comprising:
    a memory;
    a processor;
    a first plurality of bijection diffusion function circuits to receive data bits from the processor, diffuse the data bits into diffused data bits and store the diffused data bits into the memory;
    an error correcting code (ECC) generation circuit to generate ECC bits for the data bits; and
    a second plurality of bijection diffusion function circuits to diffuse the ECC bits into diffused ECC bits and store the diffused ECC bits into the memory.

20. The system of claim 19, wherein the data bits are encrypted data bits, and further comprising memory encryption circuitry to encrypt other data bits to generate the encrypted data bits.

\* \* \* \* \*